US005568417A

United States Patent [19]
Furuki et al.

[11] Patent Number: 5,568,417
[45] Date of Patent: Oct. 22, 1996

[54] FLUORESCENT METHOD, FLUORESCENT DEVICE, FLUORESCENT RECORDING METHOD, FLOURESCENT RECORDING MEDIA, FLUORESCENT RECORD READING METHOD, FLUORESCENT RECORD READING DEVICE AND FLUORESCENT RECORD DELETING DEVICE

[75] Inventors: Makoto Furuki; Lyong Sun Pu, both of Ebina, Japan

[73] Assignee: Fuji Xerox Co., Ltd., Tokyo, Japan

[21] Appl. No.: 302,505

[22] Filed: Sep. 8, 1994

[30] Foreign Application Priority Data

Sep. 10, 1993 [JP] Japan .................................. 5-248577

[51] Int. Cl.$^6$ .................................................. G11C 13/00
[52] U.S. Cl. ........................................ 365/106; 365/153
[58] Field of Search .................................. 365/129, 106, 365/109, 110, 112, 120, 153, 116

[56] References Cited

U.S. PATENT DOCUMENTS 5,301,145  4/1994  Inoue ...................................... 365/106

FOREIGN PATENT DOCUMENTS 62-167631  7/1987  Japan .
3-119536   5/1991  Japan .
4-123020   4/1992  Japan .

OTHER PUBLICATIONS

"Organic Electroluminescent Diodes" (Tang et al.), Appl. Phys. Lott 51 (12) (Sep. 1987), 913–915.
"Electronic and Optical Studies with Langmuir–Blodgett Transistors", Thin Solid Films, 210/211 (1992), pp. 283–286.

*Primary Examiner*—Terrell W. Fears
*Attorney, Agent, or Firm*—Oliff & Berridge

[57] ABSTRACT

A fluorescent method comprising changing charge amount in an organic dye thin film by a voltage applied between a pair of electrodes, and increasing and decreasing efficiency of fluorescence generated by exciting the organic dye thin film with a light source depending on the change of the charge amount is disclosed. A fluorescent device comprising an organic dye thin film, a pair of electrodes disposed to apply pressure to the organic dye thin film and a light source generating fluorescence by exciting the organic dye thin film, wherein efficiency of the fluorescence is increased and decreased depending on the change of the charge amount in the organic dye thin film by voltage applied between the electrodes is also disclosed. A fluorescent recording method comprising accumulating charges in an organic dye thin film by a voltage applied between a pair of electrodes, changing efficiency of fluorescence of the organic dye thin film depending on the accumulation of charges and recording is also disclosed.

11 Claims, 15 Drawing Sheets

FLUORESCENT METHOD, FLUORESCENT DEVICE, FLUORESCENT RECORDING METHOD, FLOURESCENT RECORDING MEDIA, FLUORESCENT RECORD READING METHOD, FLUORESCENT RECORD READING DEVICE AND FLUORESCENT RECORD DELETING DEVICE

BACK GROUND OF THE INVENTION

This invention relates to a fluorescent method using fluorescence, a fluorescent device and fluorescent recording media used in a recording device, a fluorescent recording method utilizing the fluorescent recording media, a fluorescent record reading method and a fluorescent record deleting method.

As an indication element utilizing fluorescent dye thin film, an organic EL element is proposed (Appl. Phys. Lett,51 (1987),913). In the organic EL element, an organic fluorescent dye thin film is disposed in an element structure having rectifiable property, and fluorescent molecule is excited electrically by injecting electrons and positive holes from both sides of the film, and a light (electroluminescence) emitted when the excited state is brought back to a base state is utilized in indication.

The organic EL element is, as shown in FIG. 22(a), formed in such a manner that a luminescent layer 73 containing fluorescent dye is sandwiched by a cathode 74 and a transparent anode (e.g. ITO) 71 formed on a substrate 70 and a positive hole transporting layer 72 lies between the luminescent layer 73 and the anode 71 in order to increase the efficiency of injection of positive holes from the anode 71 by inhibiting the electron injected from the cathode 74 from arriving at the anode 71. In addition, a structure in which an electron transporting layer 75 lies between a cathode 74 and a luminescent layer 73 is also proposed depending on the characteristics of the luminescent layer 73 (FIG. 22(b) and FIG. 22(c)).

The organic EL element having the above structure requires a constitution by which electrons and holes are recombined in a high efficiency in the luminescent layer 73 containing the fluorescent dye. Moreover, in order to increase the luminescent efficiency of the luminescent layer 73, the injection property of charge from each electrode is required to be increased and the electrode material and the charge transporting material are limited by the character of the fluorescent dye of the luminescent layer 73. Consequently, electric material having as small work function as possible should be used as cathode material. The electric material having small work function may include many materials having high activities and low stabilities such as Mg, Ag alloys. Since many of these electrode material have no transparency, electrode having good transparency such as ITO is generally used for anode 71. In addition, even if electrons and positive holes are ideally recombined in a high efficiency in the luminescent layer 73 with a most appropriate element structure, electric excitation process of the dye molecule is much lower efficient than optical excitation process so that excess electric energy must be supplied to the element and thus there was a problem that the excess energy supply decreased life of the organic EL element remarkably.

On the other hand, signals having good bright/dark ratio may be operated by a low energy supply if fluorescence generated from organic dye film is used by light excitation in an indication device or recording device.

As an indication element using fluorescence, a color liquid crystal device e.g. as shown in FIG. 23 is proposed. The device is formed in a manner such that a liquid crystal layer 80 containing two-color dye 81 is sandwiched by a common transparent electrode (ITO) 82 and an individual electrode 83, a fluorescent dye film is used for color filter layer 84 formed on one side of the liquid crystal layer 80, and reflecting type fluorescence 85 may be observed only at a site applied by a voltage, by which a bright and good contrast indication element is realized (JP-A-4-123020 (The term"JP-A" as used herein means an "unexamined, published Japanese Patent application")).

However, with the above structure, since the fluorescent ON-OFF uses excited light ON-OFF and the fluorescent dye film used as a color filter layer 84 does not made switching action, there exists a problem that the fluorescent dye film has no active action at all and an excess element structure is required.

As a recording media using fluorescence, a structure in which a reflection layer 91 is formed on a substrate 90 and a recording layer 92 comprising organic dye or the like having e.g. photochromic property is formed on the reflection layer 91 is proposed. The recording media can be used for a recording signal regenerating method reading the presence or absence of photochromic reaction by ultraviolet rays or of denaturation of optical fluorescent dye and it has an effect that good regenerative signals may be obtained even with a low level writing (JP-A-62-16763).

However, there exists a problem in reversibility and repeated stability in the above recording method with the recording media, since the method utilizes a photochromic reaction difficult to be occurred irreversibly in a solid accompanying molecular structural change or a completely irreversible modification and it utilizes a high energy ultraviolet rays to be expected to give damage on molecular bonds in writing record.

In addition, it is disclosed in Thin Solid Films 210/211 (1992)283 that charges are induced in a conductive polymer LB film and fluorescence intensity from the polymer LB film is decreased by applying about 100 V voltage to a gate electrode in a thin film transistor using an organic conductive polymer LB film (Langumuir-Blodgett film). However, since source-drain electrode space is much bigger (1 to 10 μm) than LB film thickness (200 to 300 Å) so that almost electric field exists in a space having no organic polymer thin film, electric efficiency is low and comparative high conductivity is required for the organic thin film. Moreover, the fluorescent intensity of the used organic conductive polymer film is changed in decreasing direction and the luminescent efficiency of the fluorescence is relatively low so that powerful excitation light source should be used to obtain fluorescent signals.

SUMMARY OF THE INVENTION

Accordingly, it is an object of the present invention to provide a realizable fluorescent device and fluorescent recording media having a simple structure by which an increase and decrease of high efficient and high contrast fluorescent intensity may be obtained reversibly with an operation giving no damage to an organic dye thin film by applying a relatively low voltage to the organic dye thin film.

To achieve the above objects, the fluorescent device of the present invention comprises an organic dye thin film, a pair of electrodes disposed so as to apply a voltage to the organic dye thin film and a light source generating fluorescence by exciting the organic dye thin film and is characterized in that the efficiency of the fluorescence is increased and decreased by a voltage applied between the electrodes.

BRIEF DESCRIPTION OF THE DRAWINGS

FIG. 6(a) shows a structure in which an excited light of an organic dye thin film and fluorescence transmit the upper electrode, FIG. 6(b) shows a structure in which an excited light of an organic dye thin film ret the upper electrode and a fluorescence ret the electrode substrate, FIG. 6(c) shows a structure in which an excited light of an organic dye thin film ret the electrode substrate and a fluorescence ret the upper electrode and FIG. 6(d) shows a structure in which an excited light of an organic dye thin film and fluorescence transmit the electrode substrate.

FIG. 7(a) shows a structure in which an excited light is waveguided into an electrode substrate, FIG. 7(b) shows a structure in which a fluorescence is waveguided into an electrode substrate and FIG. 7(c) shows a structure in which an excited light and a fluorescence are waveguided into the electrode substrate.

FIG. 18 is a characteristic curve showing fluorescent intensity change at an operation where a mixed LB film of aa molecular layers of squalilium dye and cadmium arachicate is formed via a $SiO_2$ insulating film on an ITO electrode and a constant-voltage is applied between the upper electrode and the ITO electrode in the fluorescent element as shown in FIG. 17.

FIG. 22(a) shows a structure having a positive hole transporting layer between an luminous layer and an anode, FIG. 22(b) shows a structure having an electron transporting layer between an luminous layer and a cathode, FIG. 22(c) shows a structure having both of a positive hole transporting layer and an electron transporting layer.

DETAILED DESCRIPTION OF THE INVENTION

Figure 1:
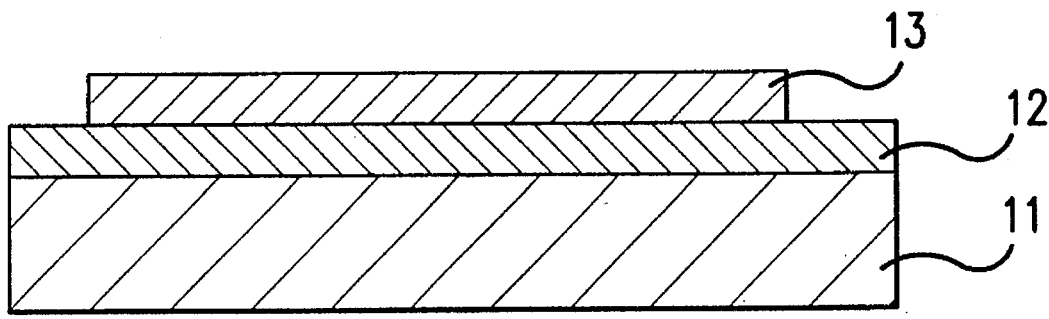
FIG. 1 is an explanatory cross-sectional view showing one example of electrode ret of a fluorescent element of the fluorescent device and fluorescent recording media of the present invention.

Since the pair of electrodes having the above structure may be disposed so as to apply a voltage to an organic dye thin film, the pair of electrodes has a structure in which an organic dye thin film 12 is formed on an electrode substrate 11 and another electrode 13 is disposed on the organic dye thin film 12 for example shown in FIG. 1, or a structure in which an insulating film 22 is formed on an electrode substrate 21, a mesh electrode 23 is formed on the insulating film 22 and the mesh electrode 23 is covered by an organic dye thin film 24.

The structure of the above fluorescent device shown in FIG. 1 in which organic dye thin film is sandwiched between electrodes comprises an organic dye thin film formed on an electrode substrate, an electrode disposed over the organic dye thin film and a light source exciting the organic dye thin film and is characterized in that at least one electrode of the above electrodes has transmission to excited light irradiated to the organic dye thin film from the light source and at least one electrodes has transmission to fluorescence emitted from the organic dye thin film and efficiency of the fluorescence is increased and decreased by a voltage applied between the electrodes.

Figure 3:
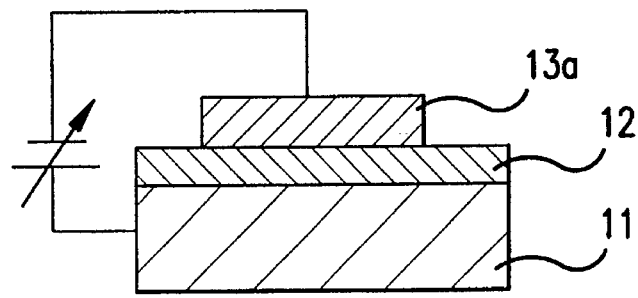
FIG. 3 is an explanatory cross-sectional view when a thin film is used for the upper electrode of fluorescent element.
Figure 4:
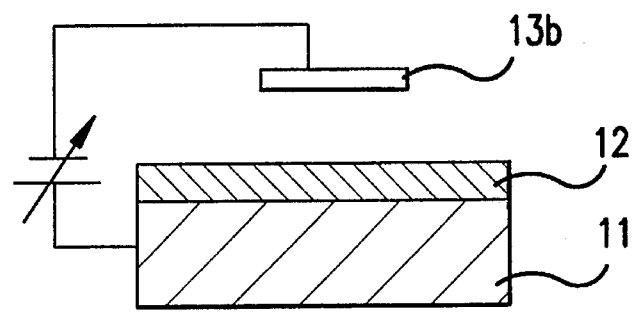
FIG. 4 is an explanatory cross-sectional view when a plate electrode is used for the upper electrode of fluorescent element.
Figure 5:
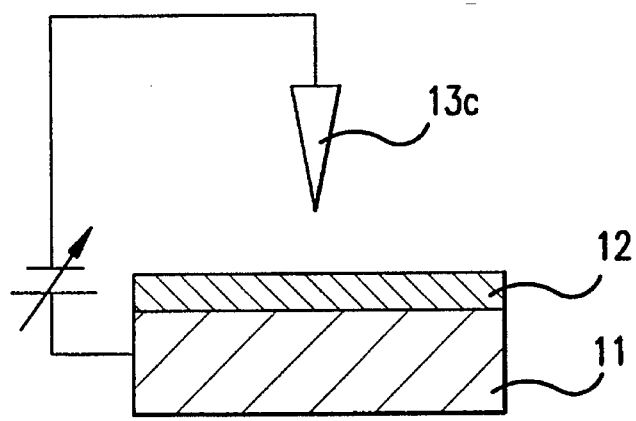
FIG. 5 is an explanatory cross-sectional view when a needle electrode is used for the upper electrode of fluorescent element.

Regarding the above structures, a disposition of an organic dye thin film formed on an electrode substrate and a upper electrode disposed over the organic dye thin film may include a case where the upper electrode 13a formed by making thin film and the organic dye thin film 12 are in contact with each other as shown in FIG. 3, and a case where the organic dye thin film 12 and plate electrode 13b or needle upper electrode 13c are not in contact with each other as shown in FIGS. 4 and 5. It is formed in such a manner that when a voltage is applied between the electrode substrate 11 and the upper electrode 13 the fluorescent intensity change of the organic dye thin film 12 is induced.

In addition, the electrode substrate 11 and the upper electrode 13 are required to have transmission to an excited light from a light source and fluorescence emitted from an organic dye thin film. As the fluorescent device in which the organic dye thin film 12 and the upper electrode 13 are in contact with each other as shown in FIG. 3, there exist four types of structures shown in FIGS. 6(a) to (d) depending on incident direction of the excited light and on discharge direction of the fluorescence. Namely, the transmission required by each electrode is varied depending on whether the excited light and fluorescence transmit the electrode substrate 11 or the upper electrode 13.

Figure 6A:
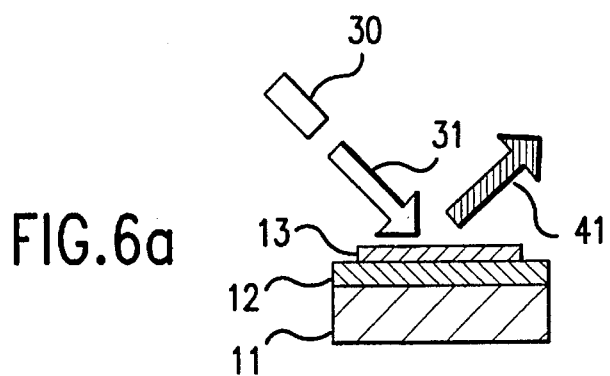
FIGS. 6(a) to (d) are explanatory views showing an optical layout in a fluorescent device and fluorescent recording media.

FIG. 6(a) shows a structure in which a upper electrode 13 exists between an excitation light source 30 and the fluorescence 41 from the organic dye thin film 12 is observed via the upper electrode 13. Since excited light 31 into the organic dye thin film 12 and the fluorescence 41 from the organic dye thin film 12 both transmit the upper electrode 13, the upper electrode 13 is required to have some transmission to the both wavelengths of the excited light 31 of the organic dye thin film 12 and the fluorescence 41.

Figure 6B:
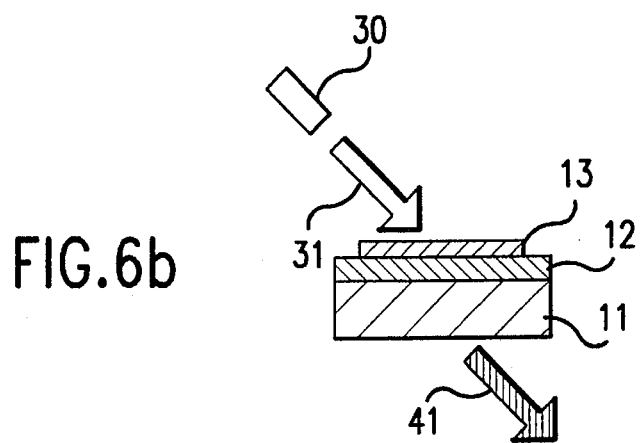

FIG. 6(b) shows a structure in which a upper electrode 13 exists between an excitation light source 30 and an organic dye thin film 12 and fluorescence 41 from the organic dye thin film 12 is observed via an electrode substrate 11. Since excited light 31 into the organic dye thin film 12 transmits the upper electrode 13 and the fluorescence 41 from the organic dye thin film 12 transmits the electrode substrate 11, the upper electrode 13 is required to have transmission to wavelength of the excited light 31 of the organic dye thin film 12 and the electrode substrate 11 is required to have transmission to wavelength of the fluorescence 41.

Figure 6C:
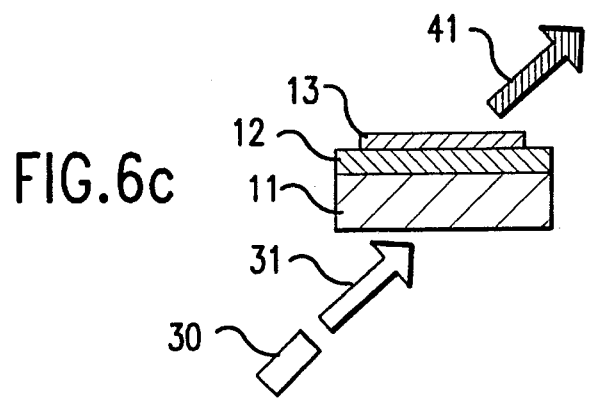

FIG. 6(c) shows a structure in which an electrode substrate 11 exists between an excitation light source 30 and an organic dye thin film 12 and fluorescence 41 from the organic dye thin film 12 is observed via a upper electrode 13. Since excited light 31 into the organic dye thin film 12 transmits the electrode substrate 11 and the fluorescence 41 from the organic dye thin film 12 transmits the upper electrode 13, the electrode substrate 11 is required to have transmission to wavelength of the excited light 31 of the organic dye thin film 12 and the upper electrode 13 is required to have transmission to wavelength of the fluorescence 41.

Figure 6D:
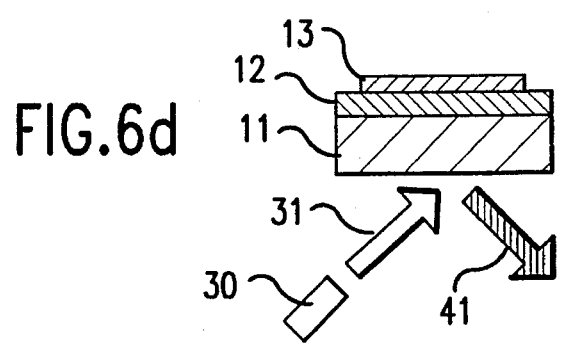

FIG. 6(d) shows a structure in which an electrode substrate 11 exists between an excitation light source 30 and an organic dye thin film 12 and fluorescence 41 from the organic dye thin film 12 is observed via the electrode substrate 11. Since excited light 31 into the organic dye thin film 12 and fluorescence 41 from the organic dye thin film 12 both transmit the electrode substrate 11, the electrode substrate 11 is required to have transmission to both wavelengths of the excited light 31 of the organic dye thin film 12 and the fluorescence 41.

The above described conditions are of course a necessary condition and both the upper electrode 13 and electrode substrate 11 may have transmission to both excited light 31 and fluorescence 41.

On the other hand, as shown in FIGS. 4 and 5, in a fluorescent device formed in such a manner that the organic dye thin film 12 and the upper electrode 13 are not in contact with each other, since excited light can irradiate utilizing a space between the upper electrode 13 and the organic dye thin film 12 to obtain fluorescence utilizing space similarly, the device may be used if excited light can irradiate to the organic dye thin film 12 and fluorescence obtained can be observed or detected by the structure even if both the upper electrode 13 and electrode substrate 11 have no transmission to excited light and fluorescence.

Figure 7A:
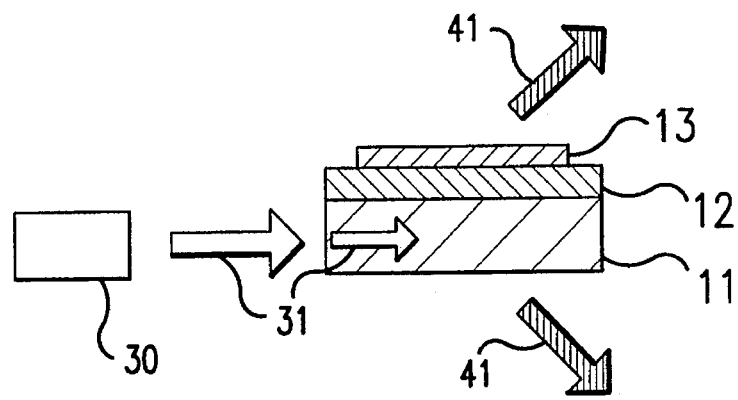
FIGS. 7(a) to (c) are explanatory views showing an optical layout when the electrode substrate is used as a waveguide path, in an fluorescent device and fluorescent recording media.

In addition, as shown in FIGS. 7(a), (b) and (c), the device may have a structure in which the excited light 31 irradiate into the organic dye thin film 12 and fluorescence 41 discharges from the thin film 12 by waveguiding the excited light 31 and/or the fluorescence 41 in the electrode substrate 11. Namely, the excited light 31 may be waveguided by end surface incidence or coupling with prism and the fluorescence 41 may be observed by end surface discharge. In this case, as the electrode substrate 11, the one having a conductivity as a whole and a waveguiding property to the excited light 31 and/or the fluorescence 41, or the one having a laminated conductive layer and waveguiding layer may be used.

Figure 7B:
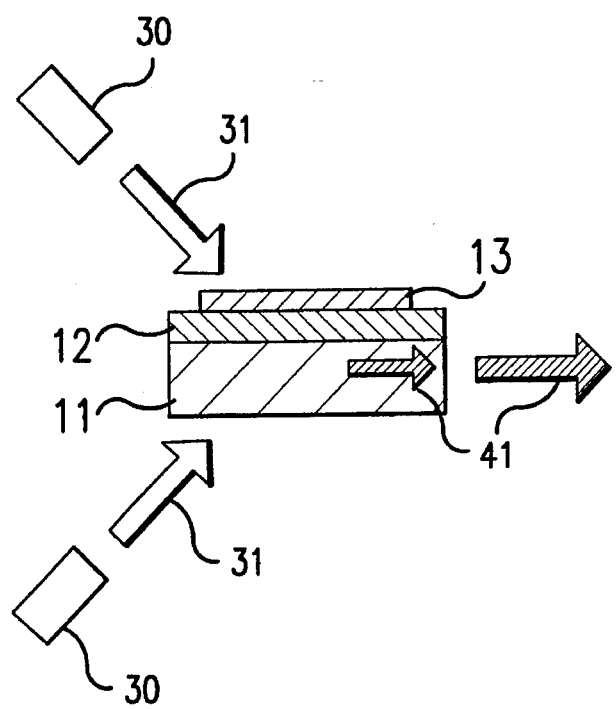
Figure 7C:
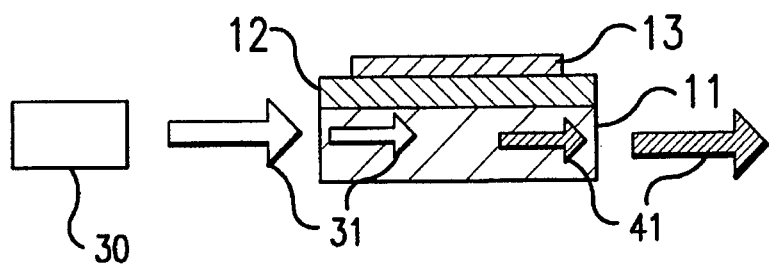

Thus the above described transmissible electrode means electrode having transmission to excited light or fluorescent wavelength light and may include an electrode which has a transmission as a whole, an electrode which has a low transmission as a whole but is given some transmission by making it thin, or an electrode which is given partial transmission by a comb or mesh structure, The fluorescent recording media of the present invention may be made by deleting the excitation light source of organic dye thin film from the above fluorescent device and comprises an organic dye thin film formed on an electrode substrate and an electrode disposed so that a voltage may be applied to the organic dye thin film, and is characterized in that recording is carried out by increasing and decreasing efficiency of fluorescence emitted from the organic dye thin film by the voltage applied between the electrodes. In the fluorescent recording media, a structure applying a voltage between the electrodes as shown in FIGS. 3, 4 and 5 in writing information is used and a constitution forming excitation light source 30 as shown in FIGS. 6 and 7 in reading information is used. Therefore, the upper electrode 13 is indispensable in writing and deleting recording but the upper electrode 13 is not indispensable in its constitution at a regeneration.

The organic dye thin film 12 containing fluorescent dye used in the fluorescent device and fluorescent recording media is formed on the electrode substrate being a support. The organic dye thin film 12 has such a characteristic that electronic state is changed with one or both electrodes by applying a voltage between the electrodes. For example, a thin film in which dye molecules of the organic dye thin film 12 induces a change of electronic state by an interaction with charges injected with the injection of charges from electrodes, and the fluorescent intensity changes reversibly. Therefore, it is desired for the organic dye thin film 12 to be formed as thin as possible to lower the resistance value so as to increase the reversibility of charge injection and improve the efficiency.

Thus the organic dye thin film interacting with charge has a semiconductivity and the characteristics are different from each other in a p-type and a n-type. In addition, regarding the fluorescent dye of the organic dye thin film 12, a dye in which electronic state is changed largely by the injected charge but also which has high chemical, electric and thermal stabilities are desired.

The thickness of the organic dye thin film 12 of the present invention is preferably in the range from 10 to 5000 Å to make a reversibility or rate of injection/discharge of charges and a voltage for inducing a sufficient fluorescent intensity change a level to be controllable in practice.

The fluorescent dye molecule which may be used for the organic dye thin film 12 may include generally dye molecules emitting fluorescence such as organic π-electron conjugated dyes e.g. squalilium dyes, cyanin dyes, merocyanine dyes, phthalocyanine dyes, porphyrin dyes, azo dyes, quinone dyes, acridine dyes, rhodamine dyes, fluorescein dyes, anthracene dyes, indigo dyes, pyrene dyes, perylene dyes. The requirements of the molecules is to be chemically stable, to generate a sufficient strong fluorescence or phosphorescence, and to be able to be made thin.

Moreover, the fluorescent dye molecules often emit very weak or even no fluorescent when they are formed in a solid form in spite that they generally emit fluorescence strongly in a liquid state. Therefore, the dye molecule used in the present invention may be used when it is introduced by a substituent or it is made into a mixed film with matrix materials so as to control the cohesion state in solid form and to improve the stability of the film.

For example, the introduction of the substituent has an effect to control the regularity when dye molecules are close to each other and to form a specific dye association efficiently. In particular, as an association, J-association having a high fluorescent intensity and a narrow wavelength width is preferable. By improvement of the regularity, the efficiency of emission and light deleting may be increased by increasing the ratio of change by fluorescent intensity. By utilizing an aggregate in which excited electron is nonlocalized in an association such as J-association, the ratio of accumulated charge amount and fluorescent emission efficiency change may be increased extremely.

on the other hand, as a matrix material, a surface active material being in a solid state at room temperature such as long-chain aliphatic acids, long-chain alcohols, long-chain amides, long-chain sulfides, and a polymer material having a relatively high transparency such as polyethylenes, polyesters, polycarbonates, polyacryls, polyamides, polyimides may be used so as to improve film-making property of the dye molecules. In addition, to control injection property of charges, a conductive polymer such as polythiophenes, polyphenylene vinylenes, polypyrroles and a charge transporting material such as diamines, triphenylamines, carbazoles, polysilanes may be used as a matrix body or used with mixing with another matrix material. These introductions of matrix material enable to fix the regular layout of the aggregate to make film thin.

In every cases, it is basically required to emit fluorescence having a sufficiently observable intensity in a whole solid thin film state.

As the organic dye thin film 12 disposed between electrodes, a uniform single layered thin film is basically used. However, depending on the electrode material used or semiconductivity of the dye molecules, fluorescent intensity change may be attained more efficiently in some cases, by forming a thin film layer 14 containing no organic dye between the interfaces of the organic dye thin film 12 and the electrode substrate 11 (FIG. 8(a)), by forming the thin film layer 14 containing no organic dye between the interfaces of the organic dye thin film 12 and the upper electrode 13 (FIG. 8(b)), by forming the thin film layer 14 containing no organic dye at the both interfaces of the organic dye thin films 12, or by forming the organic dye thin film layers 12 and thin film layers 14 containing no organic dyes by turns so as to control the interaction with charges and concentrations. The thin film layer 14 containing no organic dye used in these cases may include the above-described matrix materials, organic/inorganic insulating material such as $SiO_2$, SiN, the above-described conductive polymer materials or charge transporting materials, or a thin film in which these materials are mixed with matrix materials.

The dye molecule used for the organic dye thin film 12 may comprise one type of dye molecule basically but may comprise a plurality of dye molecules if desired. In the cases, if excitation energy movement or charge movement are used positively, much powerful fluorescence may be used and charges may be controlled easily. When using several kinds of dye molecules, each dye molecule is mixed into a single layer to make film thin or it is formed into separate layers to make a laminate structure taking into consideration of a direction of electric field applied from the two electrodes, a direction of energy movement and a transparency of the electrodes.

The electrode substrate 11 of the fluorescent device and fluorescent recording media of the present invention, when opaque electrode is used for the upper electrode 13, may include a transparent substrate such as glass, quartz or plastics on which a metal material such as gold, silver, aluminum, chromium or a semiconducting material such as silicone is formed in a semitransparent thickness or comb or mesh form, a glass substrate forming a transparent semiconductor and semiconducting substrate having a light transmission at a wavelength range used.

When a semi-transparent electrode is used for the upper electrode 13 or when a electric field is applied via an air, the electrode substrate 11 is not required to be transmissive to excited wavelength and fluorescent wavelength and various kind of metals and semiconductive materials may be used.

As the upper electrode 13, a thin film such as a metal film or semiconducting film may be used and when the upper electrode 13 is in contact with the organic dye thin film 12 and the electrode substrate 11 is opaque, a metal material such as gold, silver, aluminum or chromium which has a semi-transparent thickness or is formed in comb or mesh shape, a semiconducting material having a light transmission in the wavelength range used. When the material having a light transmission in the wavelength range used is used for the electrode substrate 11, various kind of metal films and semiconducting films may be used since the upper electrode 13 is not required to have a light transmission. In addition, by using a thin film as the upper electrode 13, a fine grained pattern may be formed easily.

On the other hand, when the upper electrode 13 is not in contact with the organic dye thin film 12 in the structure, various metals or semiconducting materials formed in a plate or needle shape may be used for the upper electrode 13. In such cases, the space between the upper electrode 13 and the organic dye thin film 12 may be a length which can induce charge sufficiently to the organic dye thin film 12 but if a inner-surface distribution of fluorescent intensity is required with a better resolution or a lower energy, the space is required to be smaller.

In particular, when a high density fluorescent recording media making record of nm order using a needle upper electrode 13c is prepared, to control position of the needle upper electrode 13c, a space between an electrode cut into an atom order as used for scanning tunnel microscope and an electrode of nm order, and position and scanning control system using a piezo element controlling electrode position are utilized.

In the fluorescent device of the present invention, as a luminous element used as an excited light source 30 to emit fluorescence from the organic dye thin film 12, a semiconducting laser, a gas laser, LED and a white light separated by filter or diffraction grating may be used. Especially when the excited light 31 from the excited light source 30 is mixed with a light having the same wavelength as the fluorescence 41 emitted from the organic dye thin film 12, a noise decreasing of the fluorescent intensity measurement may be attained by disposing a spectral filter depending on the necessity between the excited light source 30 and the organic dye thin film 12.

With the present invention, a display element, a switching element and a device exchanging electric signals to light signals having a high S/N rate and outputting them may be realized, such as a fluorescent display element which comprises an organic dye thin film, an electrode disposed planarly and a light source and displays images by changing the efficiency change of fluorescence occurred by the electric signal to a fluorescent intensity distribution; a switching element converting the efficiency change occurred by electronic signal to a fluorescent intensity change, i.d. a light signal change by an excited light irradiation; or a space modulator operating them planarly.

In addition, by using a structure of the organic dye thin film and the electrode in which charges are accumulated and holed in the organic dye thin film, a high density fluorescent recording media and a device may be realized which may memory a given fluorescent luminous efficiency, may record by multivalues analogously with a high S/N rate by a light source and a fluorescent light receiving element and in which recording state is not changed at all to reading.

Figure 2:
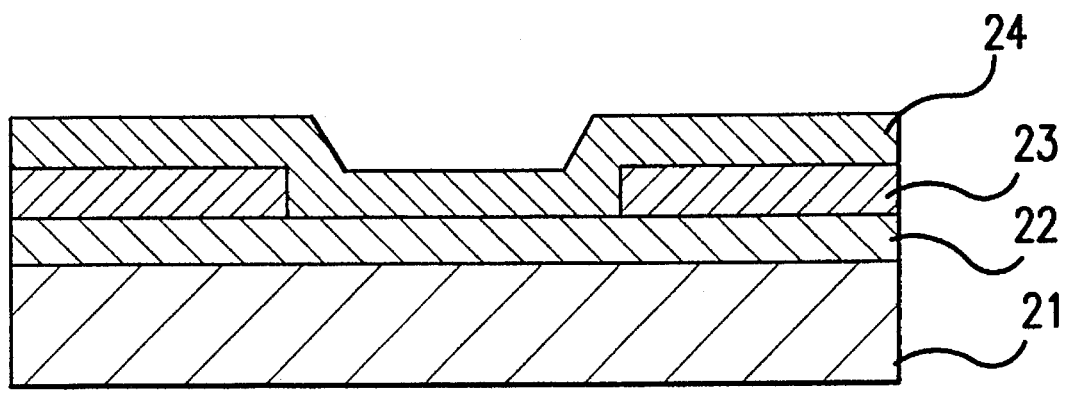
FIG. 2 is an explanatory cross-sectional view showing another example of electrode ret of a fluorescent element of the fluorescent device and fluorescent recording media of the present invention.

Thus with the fluorescent device and fluorescent recording media having the above structure, when a voltage is applied between the electrode substrate 11 and the upper electrode 13 as shown in FIG. 1 and between the electrode substrate 21 and the mesh electrode 23 as shown in FIG. 2, the charge is injected to the organic dye thin films 12, 24 from the electrodes, exchanges of the charges between the molecules in the thin films are made, the electronic state of the organic dye molecules in the thin films is changed. As one of the results, the charges are discharged in a process different from the process where an excited energy in the organic dye molecules emit a normal fluorescence, e.g. a process where phonon/heat or another wavelength light is emitted. Thus the decrease of the fluorescent intensity (fluorescent deleting) may be observed by applying a voltage between the electrodes.

Further, when dye molecules are distributed in the thin film in a high concentration and an association is formed in which excited energy movement is occurred in the molecules, the fluorescent deleting acts as a trapping site against the excited energy of another dye molecule where molecules interacting electrically with charge, and the above effects are amplified since the fluorescent luminous efficiency of not only the molecules interacting but also the near molecules are decreased.

On the other hand, a charging trapping site may be formed before applying a voltage between the electrodes in the organic dye thin film by an internal electric field applied on adsorption gas (e.g. oxygen), impurities, interface with the electrode, dye molecules and matrix molecules, dye molecules and another dye molecules. When charges (positive holes for − charges, electrons for + charges) neutralizing charging act on the charging trapping site on the contrary, the effect as a trapping site of the excited energy is deleted. In the cases, the fluorescent luminous efficiency increases in the whole thin film.

As described above, with the fluorescent device and fluorescent recording media of the present invention, the fluorescent intensity change may be occurred by applying a voltage between the electrodes.

The fluorescent intensity change may be observed in different directions depending on whether the voltage applied between the electrodes is positive or negative and on the difference of the semiconductivity of the dyes. When spacial charge distribution change is produced in the thin film containing an organic dye, the concentration of the positive holes increases if a p-type semiconducting dye molecules are used as the dye molecules in the thin film. When the interaction with the dye molecules become distinguished, the fluorescent intensity decreases and on the contrary when the concentration of electrons are increased, the fluorescent intensity are increased. On the other hand, when a n-type semiconducting dye molecule is used as a dye molecule in the thin film, the fluorescent intensity is decreased by increasing the concentrations of the electrons and on the contrary the fluorescent concentration is increased by increasing the concentrations of the positive holes.

Thus in the organic dye thin film using a p-type semiconducting dye molecules, a trapping site is formed to the excited energy by the interaction of positive hole and dye molecule, and the trapping site is neutralized to the excited energy by increasing electrons. On the other hand, in the organic dye thin film using a n-type semiconducting dye molecules, a trapping site is formed to the excited energy by the interaction of electrons and dye molecules, and the trapping site is neutralized to the excited energy by increasing positive holes. Therefore, the direction of fluorescent intensity change is determined by the relation of the bias voltage direction and the semiconductivity of the fluorescent dye.

Figure 9A:
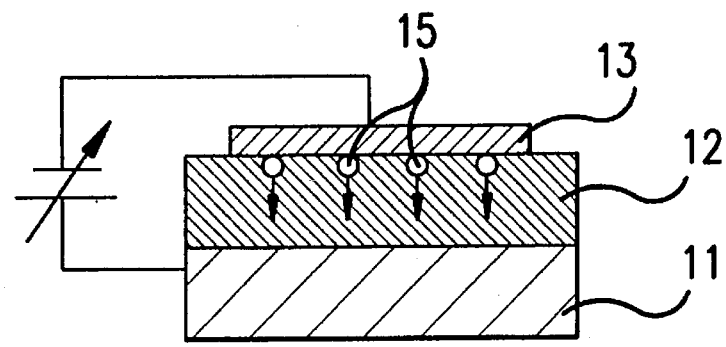
FIGS. 9(a) to 9(d) show ideal explanatory views showing charge injection states at the operation and record writing and deleting in a fluorescent element.
Figure 9B:
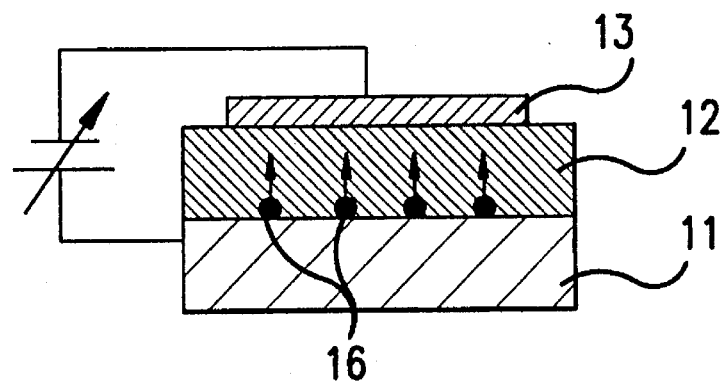

Regarding the voltage applying to the electrodes, there are four operating states as shown in FIGS. 9(a) to (d). When a p-type semiconducting dye molecule is used as the organic dye thin film 12, the fluorescent intensity is decreased in the states of (a) and (c) where positive holes 15 are injected or induced to the dye molecules and the fluorescent intensity is increased in the states of (b) and (d) where electrons 16 are injected or induced to the dye molecules. When a n-type semiconducting dye molecule is used as the organic dye thin film 12, the fluorescent intensity is increased in the states of (a) and (c) where positive holes are injected or induced to the dye molecules and the fluorescent intensity is decreased in the states of (b) and (d) where electrons 16 are injected or induced to the dye molecules. FIG. 9 shows the injection of charges from the electrode to the organic dye thin film 12 but the same phenomenon may be obtained even if the charges are injected from the organic dye thin film 12 to the electrode. In fact, when a voltage is applied with the upper electrode 13 being + bias as shown in FIGS. 9(a) and (b), whether the state shown in FIG. 9(a) or FIG. 9(b) is obtained or both states are obtained at the same time depends on the band structure of the organic dye thin film 12, the band structure of each electrode (work function in the case of metals) and a bias voltage. Thus the electrode materials constituting it are required to be selected from the view point of the desired phenomenon or characteristics of the dye molecules.

Moreover, by applying a reverse bias or discharging, the accumulated charges return back to an original state by injecting electrons to the electrode injecting charges or injecting reverse charge from another electrode.

In order to generate the charge amount change conspicuously and constantly in the organic dye film by the charge injection, it is desirable that the film thickness is about 10 to 5000 Å to inhibit a higher resistance of the organic dye thin film and the distribution of resistance in a thickness direction. To make the organic dye thin film as thin as it is in the range of the above thickness, the reversibility and speed of the charge injection/discharge and the voltage generating a sufficient fluorescent intensity change may be of the levels being controllable in practice.

Alternatively, as shown in FIG. 8, the thin film layer 14 containing no dye may be an insulating film and may be used as a charge transporting layer transporting either one of charges of electrons or positive holes and it may be formed in such a manner that only either charges are injected selectively. Thus if an insulating material is used as a thin film layer 14 containing no dye, only charges injected from either one of the electrodes may be blocked, and if an electrons or positive holes transporting material as a thin film layer 14 containing no dye, the charges may be injected positively and reverse charges may be blocked. It is applicable in the case as shown in FIGS. 9(c) and (d) where a reverse bias is applied.

Further, in the structure as shown in FIGS. 4 and 5 in which the upper electrode 13 is not in contact with the organic dye thin film 12, depending on the relation between a gap space between the upper electrode 13 and the organic dye thin film 12 and a voltage and an atmosphere where the fluorescent device is disposed (in an air, in an inactive gas or in a vacuum), it can be controlled whether a current (corona discharge and tunnel current or the like) may flow through the gap or not. Thus in the cases, there are four operation (recording writing) states as shown in FIG. 9 showing structures in which the upper electrode 13 is in contact with the organic dye thin film 12, it may be selected that the operation is made in which state, from the relation of the band structure of the electrode substrate 11 and the organic dye thin film 12, the utilization of the thin film 14 containing no dye and the relation of gap with the upper electrode 11 and voltage.

The invention is used for display device, switching device, fluorescent device in memory device and recording media but the required performances are different depending on the usages. Therefore, the forms and materials of electrode constituting the device, structure and materials of organic dye thin film must be selected depending on the usage. The structures appropriate for each usage will be explained.

If the fluorescent device of the present invention is used as a display/switching element operating at a relatively high speed, injection and discharge of charge are required to be made reversely and quickly. Namely, in the above element, the exchange of the charges in the interface of electrode and organic dye thin film is required to be quickly, and the movement of charges in organic dye thin film is required to be fast. Thus at an interface of electrode injecting charges and organic dye thin film, the selections of electrode material and organic dye thin film material in order to make barrier to the injected charges small and the selection of structure of the thin film and organic dye molecule/matrix materials in order to elevate the movement rate of the injected charge in the thin film are required. It is effective to make smaller the gap between the conductive band of the organic dye molecule and the conductive band of the electrode substrate (work function in the case of metals) of the electrode substrate in order to inject electrons from the electrode injecting electrons into the organic dye thin film quickly.

In addition, in order to inject positive holes quickly from the electrode injecting positive holes into the organic dye thin film, it is effective that the gap between the valence band of the organic dye molecule and the valence band (work function in the case of metals) of the electrode substrate is made small. Further, to elevate the concentration of dye molecule or to make the thickness of the thin film as thin as possible in order to occur the desired charge movement in the organic dye thin film, to select a matrix material having a good transporting property of the object charge, and to add charge transporting material in the thin film lead to a fast operations. In the cases, it is effective to form a charge transporting layer between them in a sense that gap between the band structure or the organic dye molecule and the band structure of the electrode are regulated. Namely, in a single bias direction, it is determined that which charges are injected predominantly depending on the balance of each gap, the charge density of the electrode material and the bias voltage values if the gap to the charge injection at both electrode interface is not large. Therefore, the fluorescent intensity is increased or decreased transitionally depending on the operation voltage or charge amount injected.

On the other hand, if a gap of the charge injection at either electrode interface is large or if it is so formed that the charge injection is blocked between the one of the electrode and the organic dye thin film, the fluorescent intensity change is observed only in the direction of the fluorescent intensity change determined by the charge injected. Further, if a bias is applied in the opposite direction, a reverse condition is applied. Therefore, the structures must be selected how it is operated.

When the fluorescent device and recording media of the present invention are used as a memory display, switching element or a recording device, the charges injected are required to be held as long as a discharge via an external circuit, a neutralization by reverse charge injection from the electrode, or discharge by a reverse bias application/heating is not made. Namely, when the external circuit is opened or is applied by a constant-voltage, it is desired that there are no exchange of charges at the interface of electrode and organic dye thin film and no charge movement inside the organic dye thin film.

As for the element structure exhibiting memory property, it is operated by injecting charges from only one of the electrode interface in a basically single bias direction. Namely, it has such a element structure that a reverse charge injection is not made from the other electrode. At the interface between the electrode injecting charges and the organic dye thin film, the selections of electrode materials and organic dye thin film materials so as to make the barrier small to the charge injected and large to the charge discharged, and the selection of the thin film layouts and the organic dye molecule and matrix materials so as to have a high holding property of the charges injected in the thin film are required.

It is effective that the electrons injection from the electrode injecting charges to the organic dye thin film is made fast and, on the other hand, that the conductive band of the electrode substrate (work function, in the case of metal) is made lower than the conductive band of the organic dye molecule (energy difference to vacuum order is made lower) in order to avoid the returning to the electrode. Alternatively, at the opposite electrode side, it is effective that the valence band (work function, in the case of metal) of the electrode substrate is made lower than the valence band of the organic dye molecule (energy difference to vacuum order is made lower) in order to avoid the injection of holes into the organic dye thin film.

It is effective that the positive holes injection from the electrode injecting positive holes to the organic dye thin film is made fast and, on the other hand, that the valence band of the electrode substrate (work function, in the case of metal) is made higher than the valence band of the organic dye molecule (energy/ difference to vacuum order is made lower) in order to avoid the returning to the electrode. Alternatively, at the opposite electrode side, it is effective that the conductive band (work function, in the case of metal) of the electrode substrate is made higher than the valence band of the organic dye molecule (energy difference to vacuum order is made lower) in order to avoid the injection of charges into the organic dye thin film.

Further, in order to increase the holding property of the required charges in the organic dye film, the regulation of concentration of the dye molecules and thickness of the thin film, the usage of matrix materials in which the object charges are trapped or held more strongly and the formation of blocking layer blocking the discharge of the charges between the electrode are effective. The blocking layer may comprise an entirely insulating material. However, for example if a light conducting polymer producing conductivity by an irradiation of a light having a shorter wavelength than the excited wavelength of the organic dye molecule such as polyvinylcarbazol and polyparaphenylene is mixed in matrix material, a record is holed at a normal state, but by irradiating a 300 to 400 nm of ultraviolet rays, the recording state may be deleted by neutralization or discharge of the charge accumulating in the organic dye thin film. In addition, by using a light semiconducting electrode for the electrode at the side where a blocking layer is not formed, similar effects may be attained.

As described above, by the fluorescent device and fluorescent recording media of the present invention, various operation states may be realized depending on electrode or organic dye thin film materials and their layouts and structures.

EMBODIMENT

An example of the fluorescent device and fluorescent recording media of the present invention will be described with reference to FIGS. 10 and 16.

An organic dye thin film 12 is formed on an electrode substrate 11 so as to give an exposed surface 11a of the substrate 11. On the organic dye thin film 12, a upper electrode 13 is formed. The electrode substrate 11, the organic dye thin film 12 and the upper electrode 13 constitute a fluorescent element 10. A terminal 51 is formed on the exposed surface 11a. Between the terminal 51 and the upper electrode 13, a power source 52 is connected to operate when used as a fluorescent device and to write and delete a record when used as a recording media and is designed so that a operation voltage is applied between the electrode substrate 11 and the upper electrode. An ampere meter 53 is connected in series with the power source 52 and a voltmeter 54 is connected in parallel with the power source 52 to monitor the operating states. Each measurement of the ampere meter 53 and the voltmeter 54 is feedbacked to the power source 52 via telecommunication cable 55 for feedback to control so as to keep constant values in the power source 52.

Figure 10:
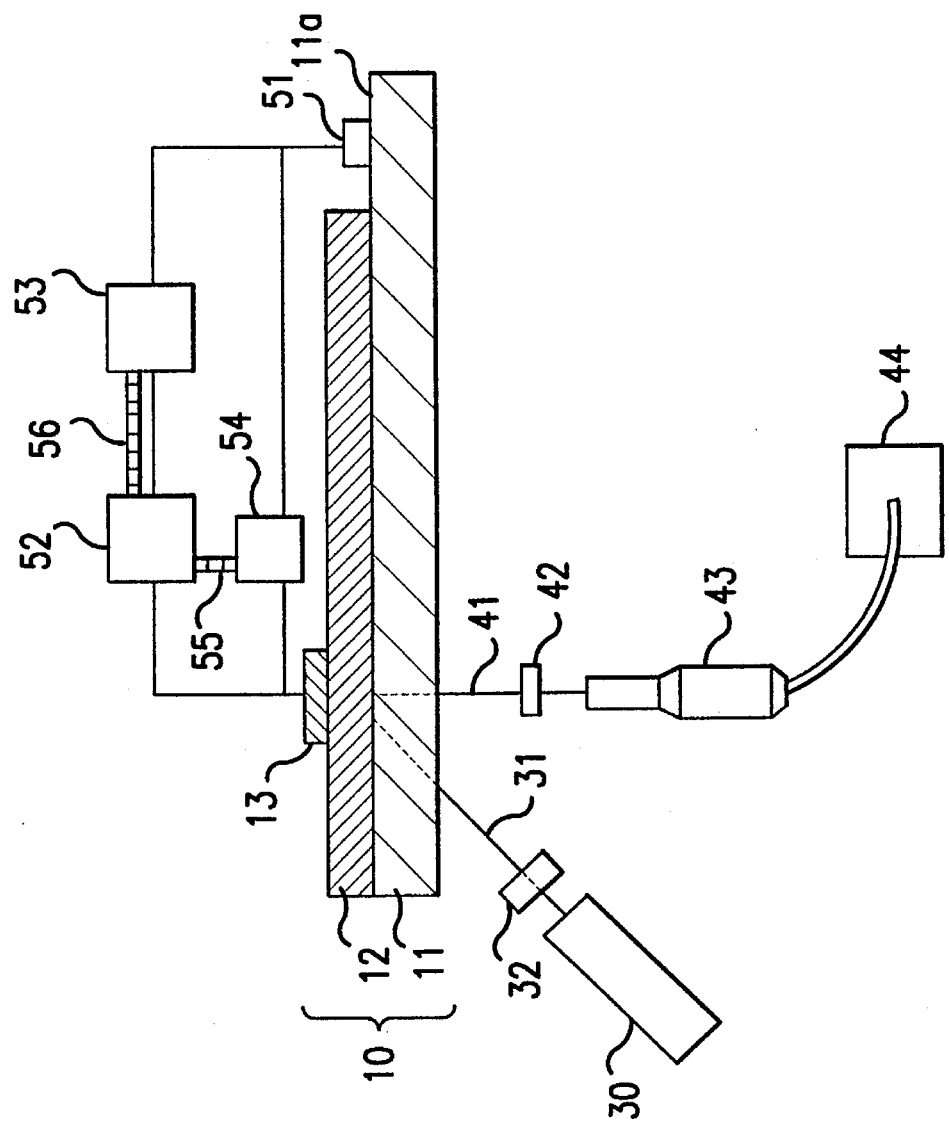
FIG. 10 shows a structural explanatory view showing an example of a fluorescent device and fluorescent recording media of the present invention.

In FIG. 10, only one upper electrode 13 is shown but a plurality of upper electrodes formed separately are required when a plurality of information are displayed and recorded at the same time since the upper electrode 13 corresponds to each bit of the display device or recording media. Moreover when a plurality of upper electrodes are formed, a switch (not shown) for selecting applying of voltage between each upper electrode 13 and the power source 52 is formed to make control.

An excited light source 30 is disposed so that an excited light 31 is irradiated to the part of the organic dye thin film 12 where a operation voltage is applied by the electrode substrate 11 and the upper electrode 13 after transmitting the electrode substrate 11. A spectral filter 32 is disposed before the incidence direction of the excited light source 30 in order to delete the same wavelength component as the fluorescent wavelength generated from the organic dye thin film 12 from the excited light 31. The excited light 31 is not required to irradiate all the time but when the fluorescent device is used as a display device, it is designed so that the excited light 31 is irradiated to the organic dye thin film 12 in displaying state. When it is used as a fluorescent recording media, the excited light source 30 is not necessary when recording and it is necessary when regenerating.

The fluorescence 41 emitted by the organic dye thin film 12 is so designed that it transmits the electrode substrate 11 to reflect outside and a spectral filter 42 is disposed in the reflecting direction so as to delete the wavelength component of the excited light contained in the fluorescence 41. Accordingly, the electrode substrate 11 is so designed to have transmission against the excited light 31 and the fluorescence 41.

An optic fiber 43 is disposed in front of the spectral filter 42 to conduct the fluorescence 41 in which wavelength component of the excited light 31 is deleted to a light receiving device 44 via the optic fiber 43.

Each component of the fluorescent device and the fluorescent recording media will be described.

The electrode substrate 11 is made by forming a semi-transparent thickness of metal, organic or inorganic semiconductor on a transparent insulating substrate such as glass or quartz, by forming a transparent semiconductor on a transparent insulating substrate or by semiconducting substrate having a transparency in the wavelength range used, and has a transparency to the excited light 31 and the fluorescence 41. As forming methods of metal or semiconductor on insulating substrate, various film-making methods such as vacuum-deposition method, MBE method, ion-beam method, CVD method may be used. In addition, as a film making method from liquid, various cast methods and spin-coating method may be used.

Figure 8A:
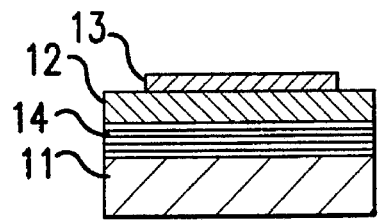
FIGS. 8(a) to 8(e) show examples of structures of the organic dye thin films of fluorescent elements, each shows a structure in which film containing no dye is formed on one or both sides of an organic dye thin film and a structure laminating organic dye thin films and films containing no dye in turns.
Figure 9C:
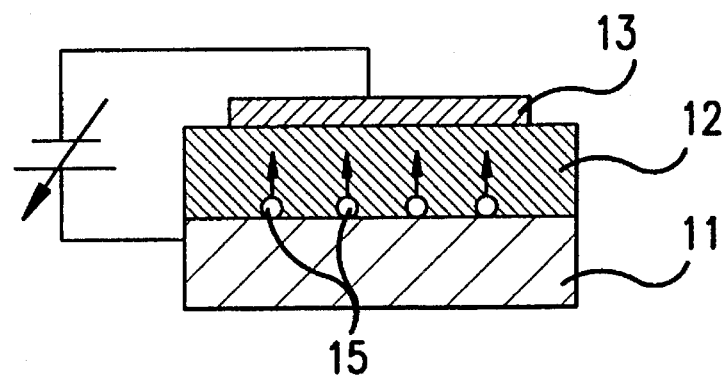
Figure 9D:
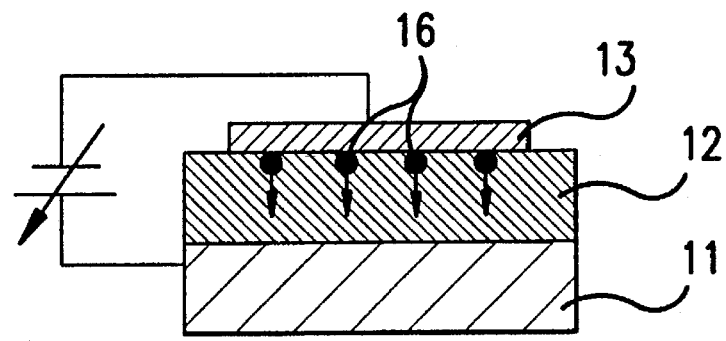

As shown in FIG. 8(a), if an insulating layer comprising an inorganic material as thin film 14 containing no organic dye lies between the electrode substrate 11 and the organic dye thin film 12, a substrate such as a single crystal Si which has grown to an epitaxy from an insulating layer such as $SiO_2$ may be used.

The terminal 51 formed on the electrode substrate 11 has preferably no electrical resistance between the electrode substrate, and a metal material is mainly used as a component of the terminal. For example when a semiconductor is used for the electrode substrate 11, a contact resistance may sometimes occur between the metal terminal 51 but the contact resistance may be decreased by making work function of the metal terminal material to be ohmic contact or by thermal annealing.

The organic dye thin film 12 is formed on the electrode substrate 11 by various vacuum film making methods such as vacuum-deposition method, MBE method, ion-beam method, CVD method and various casting methods making film from a solution or melt solution or spin-coating method. In particular as a method for making very thin and uniform film controlling the association state of the organic dye thin film 12, Langumuir-Blodgett (LB) method transitting a monomolecular film on water surface generated from an organic solvent solution to a substrate is preferable.

Moreover, as shown in FIG. 8, a similar film making method may be used when making a thin film 14 containing no organic dye.

The upper electrode 13 comprises a metal or various organic and inorganic semi-conductor and it is laminated or contact-disposed on the organic dye thin film 12. A substrate electrode made by laminating a metal or semiconductor on an insulating substrate such as glass, quartz and mica, or on a metal or semiconductor substrate in the same manner as the formation of the electrode substrate 11 may be contact-disposed, with the laminated metal or semi-conductor side being on the side of the organic dye thin film 12.

Further, a substrate on which the upper electrode 13 is disposed separately from the organic dye thin film 12, a non-contact structure in which the upper electrode 13b is not in contact with the organic dye thin film 12 may be adopted as shown in FIG. 4. A position controlling system may be preferably used which uses a piezo element on one or both of the electrode substrates 11 containing the organic dye thin film 12 and the upper electrode 13 in the position controlling when the upper electrode 13b is disposed separately from the organic dye thin film 12.

Further, as regarding the upper electrode 13, a terminal formed on the electrode substrate 11 may be formed if necessary.

As an operation method of the fluorescent device by an electronic operation system comprising the power source 52, the ampere meter 53, the voltmeter 54 and the telecommunication cable for feedback 55, a constant-voltage, constant-current or constant-charge operation method may be used. Especially when electrical resistances of the electrode substrate 11, the organic dye thin film 12 and the upper electrode 13 are relatively low, a constant-current operation is preferable. Further, as shown in FIG. 8, when the element structures is a condenser by forming the insulating layer 14 between the electrode substrate 11 and the organic dye thin film 12 and when the electrical resistance is relatively high, a constant-voltage operation is preferable. When operation, the voltage of the power source 52 may be controlled by making feedback using the values of the ampere meter 53 and the voltmeter 54 of the voltage of the power source 52. Further, when not operating, it is used in a state where the electric operation system is opened or shortcircuiting. In addition, in order to operate the fluorescent device quickly, it is preferable to change the voltage transitionally according to the work functions pre-calculated, or to apply reverse bias in order to quicken the returning in the opposite direction.

The excited light source 30 and the spectral filter 32 constitute an excited light source system of a fluorescent device. As the excited light source 30, semiconducting laser, gas laser, solid laser, dye laser and laser ray utilizing the higher harmonic, semiconducting luminous element such as LED, single colored powerful light source such as mercury vapor lamp or ultra violet lamp, white colored light source utilizing halogen, xenon or vacuum tube may be used. In addition, a color glass filter, interference film filter or spectroscope may be used to the spectral filter 32.

When laser is used for the excited light source 30 and a plate filter is used for the spectral filter, the surface of the spectral filter 32 is preferably disposed having a slight angle to a vertical line to the reflecting angle of the excited light 31 to avoid the returning of the reflected light to the excited light source 30.

The excited light source 30 may be formed so that it irradiates the excited light 31 only to the site of the organic dye thin film 12 operating or may be formed so that it irradiates all over the fluorescent element. In both cases, the shape of the excited light sources 30 is selected depending on the situation, and scanning optical system using a plate light source or mirror having the same surface area as the fluorescent element or optical system using a lens or mirror is used if desired. Further, in order to stop down the excited light 31 to a spot light, an optical system using a lens or mirror.

The spectral filter 42, the optical fiber 43 and the light receiving device 44 constitute a light receiving optical system of a fluorescent device, but the optical system is not necessary when used as a display device. The optical fiber 43 between the fluorescent element 10 and the light receiving device 44 is formed to determine the fluorescent intensity with less noises but the light receiving device 44 may be disposed directly without forming the optical fiber 43 between them. The spectral filter 42 is disposed to avoid the incidence of the excited light 31 from the excited light source 30 into a light receiving element of the light receiving device 44. A filter absorbs or reflects the excited light wavelength and transmits the fluorescent wavelength such as color glass filter, interference film filter or spectroscope may be used.

For the light receiving device 44, the ones having general light receiving element such as photodiode or multiplier phototube may be used. In addition, depending on the necessity, a photodiode array having a spectroscope or a planar sensor obtaining the information of the fluorescent device planary may be applied. Further, in the light receiving device 44, a determination with a higher S/N ratio may be made by deleting noises by a room light, by determining a light with synchronizing the excited light source 30. A more accurate operation may be made by controlling with feedback the electrical controlling system.

The concrete structure of the fluorescent element in the above-described fluorescent device and the fluorescent recording media will be described.

The organic dye thin film (dye LB film) 12 may formed by dissolving a squalilium dye represented by chemical formula 1 and arachic acid ($C_{19}H_{39}COOH$) in chloroform with a molar ratio of 1:1 to prepare a solution having a concentration of about $8\times10^{-4}M$, developing the solution in a pure water at 20° to 5° C. containing $2.5\times10^{-4}M$ cadmium chloride and $3.0\times10^{-5}M$ potassium bicarbonate and transitting a monomolecular film containing squalilium dye J-association onto an electrode substrate 11. The electrode substrate 11 was made by forming indium terminal 51 on a n-type GaP substrate and used by accumulating 1 to 41 molecular layers under 30 mN/m condition using a usual LB film making method. The n-type GaP substrate used for the electrode substrate 11 has a carrier concentration of 1.0 to $6.4\times10^{17}$ /cm$^3$. The indium terminal 51 has a ohmic contact by cutting a 1 mm$\phi$ of pure indium wire into 2 mm length, putting it on a GaP substrate and annealing at 450° C. under nitrogen atmosphere for 15 minutes and has a contact resistance in the range from 100 to 10 $\Omega$.

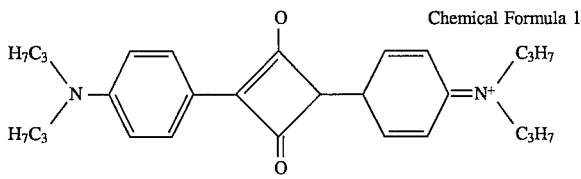

Chemical Formula 1

On the LB film side of the GaP substrate electrode (electrode substrate 11) on which the dye LB film (organic dye thin film 12) was formed. 30 µl of mercury purified as the upper electrode 13 was disposed by contacting it via a mask having a 4 mm$^2$ of opening to have a fluorescent element 10 utilizing the fluorescence from the squalilium dye J association. Since the GaP substrate is transmitted by a light having a wavelength of 570 nm or more. 2 mW of He—Ne laser was used as an excited light source 30 of the squalilium dye LB film and a spectral filter 32 cutting wavelength of 700 nm or more was used. The light transmitting the spectral filter 32 irradiates with an angle of about 45° to the vertical line of the electrode substrate from the side of the electrode substrate 11 to a side of the squalilium dye LB filter sandwiched by the electrode substrate 11 and the upper electrode 13 (mercury) as shown in FIG. 10 from the view point of the reflection prevention of the excited light 31 on the surface of the electrode substrate 11. Irradiation area by He—Ne laser was about 2 mm$^2$.

The fluorescence from the squalilium dye LB filter was emitted in a vertical direction to the electrode substrate from the electrode substrate 11 side and conducted to the light receiving device 44 via the spectral filter 42 cutting wavelength of 700 nm or more and the bundle type optical fiber 43. When observing the light from the bundle type optical fiber 43 with a spectrophotometer having a photodiode array, a powerful fluorescence having a narrow spectral width having a peak at about 760 to 775 nm specific to squalilium dye J-association was observed.

Figure 11:
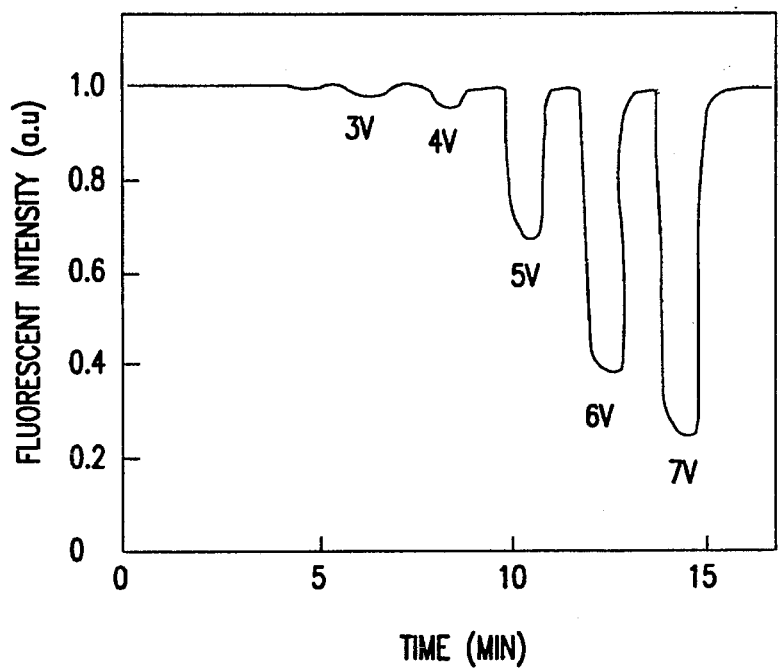
FIG. 11 shows a characteristic curve showing a fluorescent intensity changes at an operation when a fluorescent element in which a mixed LB film of 9 molecular layers of squalilium dye and cadmium arachate formed on a n-type GaP electrode substrate is used and a constant-voltage is applied between a upper electrode and an electrode substrate, in the fluorescent device and the fluorescent recording media shown in FIG. 10.
Figure 12:
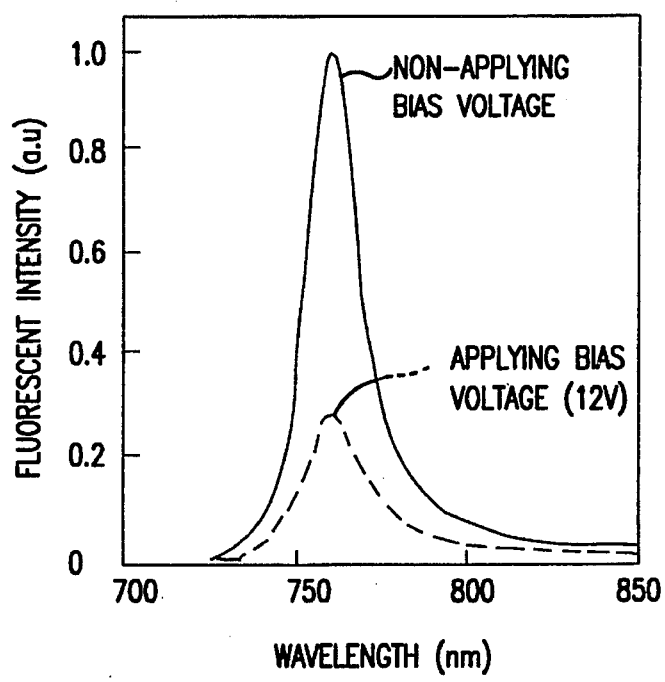
FIG. 12 shows a characteristic curve showing a fluorescent spectrum changes when a fluorescent element in which a mixed LB film of 11 molecular layers of squalilium dye and cadmium arachate formed on a n-type GaP electrode substrate is used and a constant-voltage is applied and not applied between the upper electrode and the electrode substrate in the fluorescent device and the fluorescent recording media shown in FIG. 10.

When 0 V and 1, 2, 3 . . . 10 V are applied by turns every one minute, namely, 0 V, 1 V, 0 V, 2 V, 0 V, 3 V, . . . 10 V are applied every one minute to the squalilium dye LB film (organic dye thin film 12) successively between the upper electrode 13 (mercury) and the indium terminal 51 so as to make the upper electrode 13 positive, it was observed, in one example laminating 11 molecule layers of LB layers that a 75% of distinguished and reversible fluorescence deleting was induced by 4 to 7 V of voltage application as shown in FIG. 11. FIG. 11 shows a time change of intensity at 762 nm being peak wavelength as a fluorescence intensity. As shown in FIG. 12, it was observed that the fluorescent spectrum peak wavelength is not changed on operation in the fluorescent spectrum change observed at the same time (these fluorescent intensity modulations are different more or less depending on the number of the layers of laminated LB film, but more than 80% of the fluorescent deleting and more than 200% of the fluorescent intensity increasing were observed depending on the operating voltage in the range of from 2 to 20 V bias voltage).

In addition, the similar fluorescent intensity change was observed at a reverse bias. A higher bias voltage was required at the reverse bias from the relation of work function at the fluorescent element structure and the use of a n-type semiconductor as the electrode substrate 11.

Figure 13:
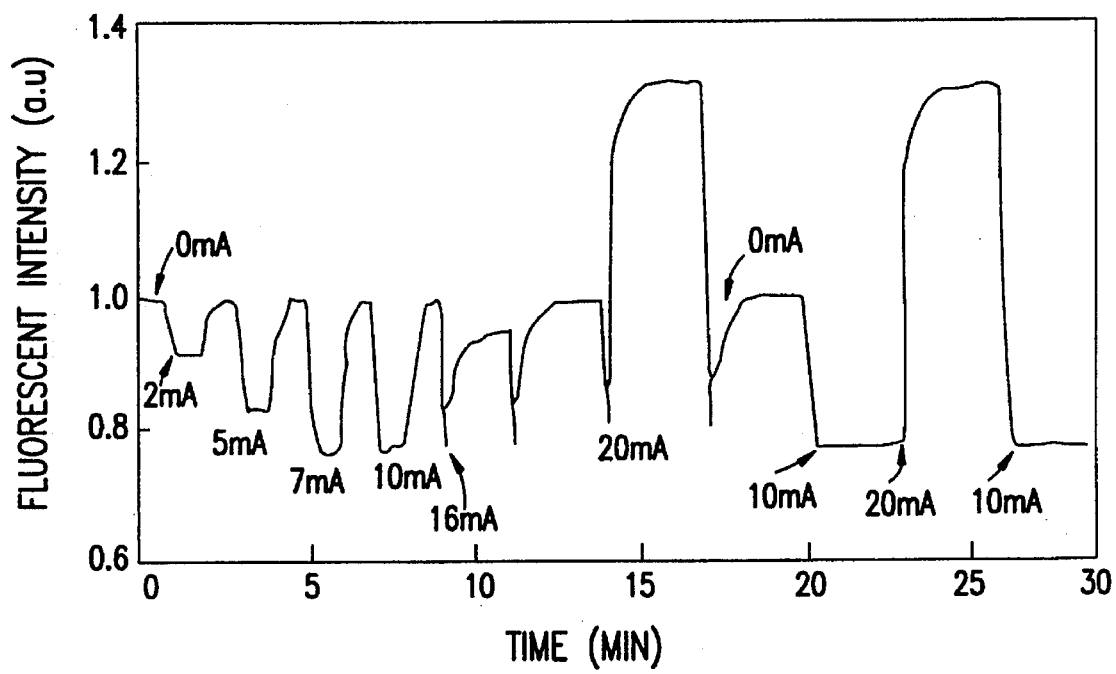

Further, regarding the fluorescent element of the above fluorescent device and fluorescent recording media, the fluorescent intensity varied depending on the current value in the range from $10^{-5}$ to $10^{-2}$ A when the fluorescent intensity was determined with flowing a constant current. In addition, when the current values increased, the types of charges injected depending on the values were changed excessively and a phenomenon that the fluorescent deleting changes to fluorescent increasing excessively was confirmed. Although the bias values are different depending on the element structure of the fluorescent element, the changes of the current values or voltage values from the state where some bias current or voltage is applied constantly enabled to induce the larger fluorescent intensity changes. As an example, the result of the operation by a constant current value in an element having 21 layers of the organic dye thin film containing squalilium dye J-association is shown in FIG. 13. As shown in FIG. 13, the fluorescent intensity is controlled depending on each current value, and the fluorescent increasing following the fluorescent deleting was excessively observed by a current value of more than 10 mA. When further 10 mA was flowed based on 10 mA (20 mA in total), it was confirmed that a larger change than the modulation from 0 mA was obtained.

Regarding the fluorescent element of the above fluorescent device and the fluorescent recording media, as shown in the above FIG. 8(a), a fluorescent element 10 was prepared by forming an organic dye LB film (organic dye thin film 12) containing 10 layer squalilium dye J-association on a GaP electrode substrate (electrode substrate 11) which has been laminated in advance by 1 to 31 layers cadmium arachate LB film (thin film 14 containing no organic dye), and the fluorescent intensity change was determined with applying a voltage in an operation state similar to the above fluorescent device. The arachic acid LB film was laminated in the following manner: Arachic acid ($C_{19}H_{39}COOH$) was dissolving in chloroform to prepare a solution having a concentration of about $2.5\times10^{-4}$M potassium bicarbonate. The solution was developed on a pure water having $2.5\times10^{-4}$ cadmium chloride and $3.0\times10^{-5}$M potassium bicarbonate and it was laminated under a condition of 30 mN/m by a usual LB film making method as the mixed film with squalilium dye.

As the results, it was confirmed that the current values decreased under the same bias voltage depending on the number of layers of the cadmium arachate LB film and the charge injection from the GaP substrate electrode 11 was controlled. Even if a bias voltage was increased more or less compared to the one having no cadmium arachate LB film by injecting positive holes from the mercury upper electrode 13 by applying a voltage with the mercury upper electrode 13 being +, a more distinguished fluorescent deleting was observed at a far lower current values of $10^{-2}$ to $10^{-17}$ A. Namely, the injected charges could be operated more efficiently compared to the one having no cadmium arachate LB film.

Figure 14:
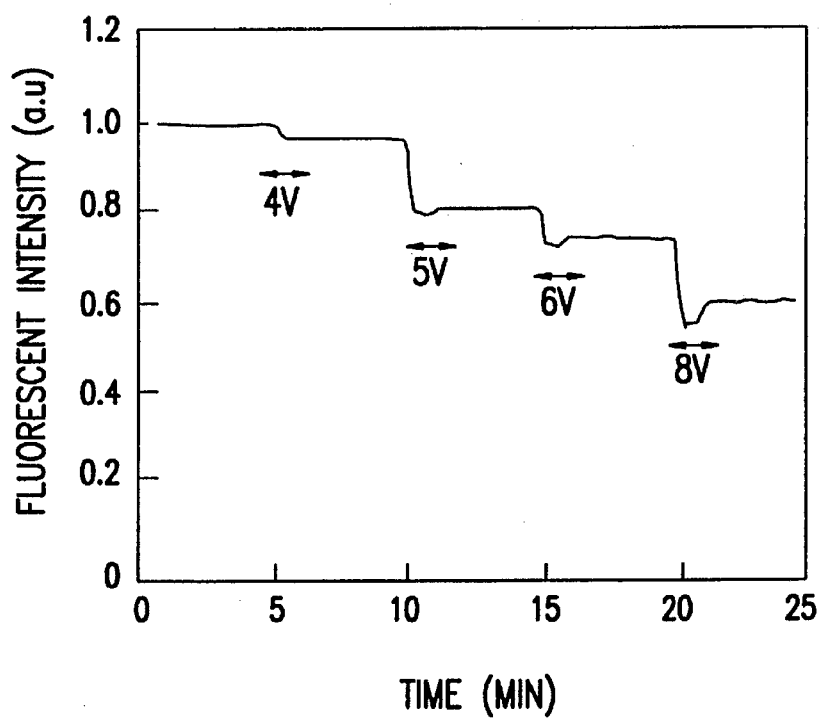
FIG. 14 shows a characteristic curve showing a fluorescent intensity changes at an operation when a fluorescent element in which a 21 molecular layers of cadmium arachate LB film is formed on a n-type GaP electrode substrate and a mixed LB film of a 10 molecular layers of squalilium dye and cadmium arachate is further formed is used and a constant-voltage is applied between the upper electrode and the electrode substrate in the fluorescent device and the fluorescent recording media shown in FIG. 10.

Further, it was confirmed that when the number of the layers of the cadmium arachate LB film was increased, the fluorescent intensity did not return to the original state even if the application of bias voltage stopped, and that the state of the fluorescent deleting was stored. Moreover it was confirmed that the state was kept as long as the accumulated charges were discharged by neutralizing with a reverse bias or flowing a higher current, that the change rate of the fluorescent intensity varied analogously depending on the charge amount injected and that it might be used as a stable t and reversible recording media having multivalues. As one example, a response characteristics curve of the fluorescent element in which an organic dye LB film containing 10 layers of squalilium J-association on a 21 layers cadmium arachate is shown in FIG. 14.

Figure 8B:
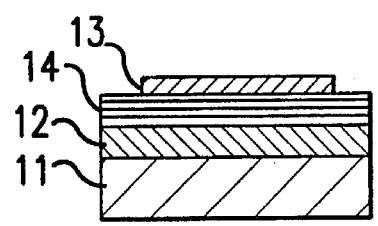
Figure 8C:
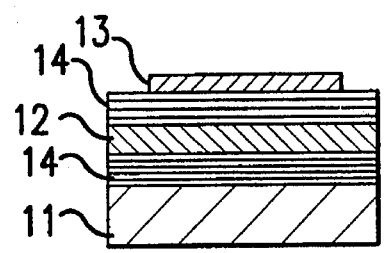

Further, in the fluorescent element of the above fluorescent device and fluorescent recording media, a fluorescent element 10 was prepared by forming an organic dye LB film (organic dye thin film 12) containing 11 layers squalilium dye J-association on a GaP substrate electrode (electrode substrate 11) as shown in FIG. 8(b), and laminating 1 to 31 layers cadmium arachate (thin film 14 containing organic dye) and the fluorescent intensity change was determined with applying a voltage in an operation state similar to the above fluorescent device.

As the results, it was confirmed that the current values at the same bias voltage was decreased depending on the number of the layers of cadmium arachate LB film and the charge injection from the mercury upper electrode 13 side was controlled. A distinguished increase of the fluorescence was observed by a very low charge injection when a voltage was applied with the mercury upper electrode 13 being + and charges from the GaP substrate electrode (electrode substrate 11) side was injected, and it was confirmed that a more efficiently injected charges were utilized by a fluorescent intensity modulation of dyes compared to the fluorescent element structure having no cadmium arachate LB film.

Figure 15:
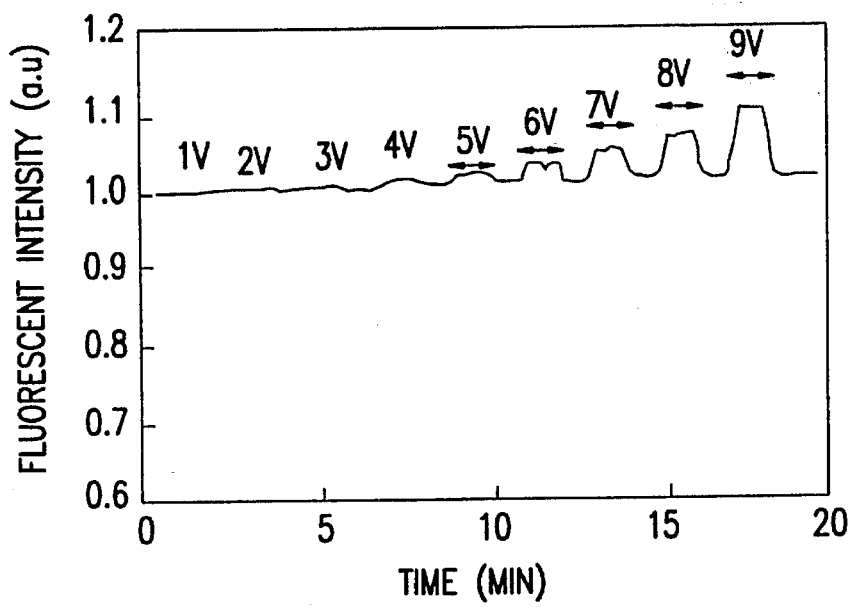
FIG. 15 shows a characteristic curve showing a fluorescent intensity changes at an operation when a fluorescent element in which a mixed LB film of a 11 molecular layers of squalilium dye and cadmium arachate is formed on a n-type GaP electrode substrate and a 21 molecular layers of cadmium arachate LB film is formed is used and a constant-voltage is applied between the upper electrode and the electrode substrate in the fluorescent device and the fluorescent recording media shown in FIG. 10.

With the fluorescent element having no cadmium arachate LB film, the increase of the fluorescence was observed via a transitional fluorescent deleting at a high voltage application or a high current injection. On the other hand, with this structure, the increase of fluorescence was occurred directly, the positive hole injection from a mercury upper electrode 13 was controlled and the fluorescent intensity change was induced only by the charge injection from GaP substrate electrode (electrode substrate 11). Further, when the number of the layers of cadmium arachate LB film increased, it was confirmed that the fluorescent intensity did not returned to an original state even if the application of voltage was stopped and that the state where the fluorescent increased was stored. Moreover it was confirmed that the state was kept as long as the accumulated charges were discharged by neutralizing with a reverse bias, flowing a higher current, or heating at about 30° C., that the change rate of the fluorescent intensity varied analogously depending on the charge amount injected and that it might be used as a constant and reversible recording media having multivalues. If 10% of photoconductive polyvinyl carbazole was mixed in the cadmium arachate LB film, the cadmium arachate/polyvinyl carbazole mixed LB film was made conductive by irradiating with a ultraviolet rays and charges were neutralized. As one example, a response characteristics of the fluorescent element in which 21 layers cadmium arachate were formed on an organic dye LB film containing 11 layers squalilium dye J-association is shown in FIG. 15.

Figure 8D:
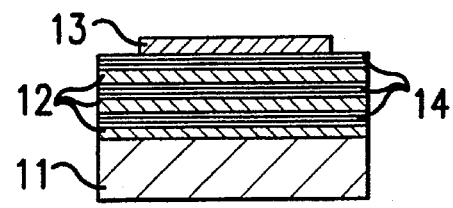
Figure 8E:
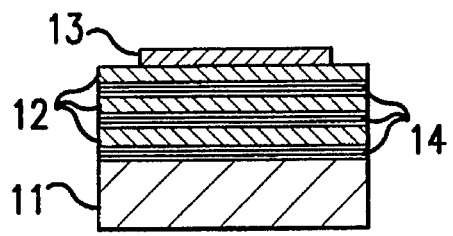

Further, in the above fluorescent element of the fluorescent device and the fluorescent recording media, a fluorescent element 10 is prepared by laminating organic dye LB film containing squalilium dye J-association and cadmium arachate LB film containing no dye by turns every one molecular layer (5 to 41 layers in total) on GaP electrode substrate (electrode substrate 11) as shown in FIG. 8(d) and (e), and the fluorescent intensity change was determined with applying a voltage in an operation state similar to the above fluorescent device.

As the results, a more distinguished fluorescent intensity change was realized on a lower charge injection level compared to the fluorescent element comprising only organic dye Lb film containing squalilium dye J-association. Namely, by the formation of the insulating layers between the layers containing dye molecules, all space charge amount existing transitionally is increased, ratio of charges interacting with the dye molecules to the transmitting charges, and a more distinguished fluorescent intensity change is occurred.

Figure 16:
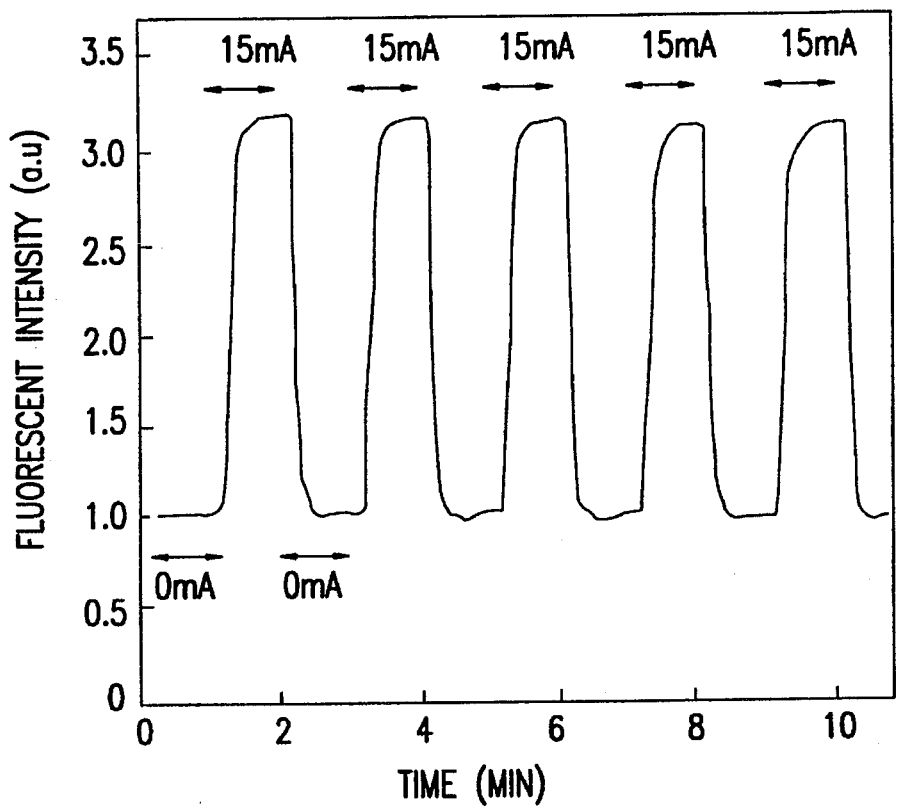
FIG. 16 shows a characteristic curve showing a fluorescent intensity changes at an operation when a fluorescent element in which a mixed LB film of a 11 molecular layers of squalilium dye and cadmium arachate and a 10 molecular layers of cadmium arachate LB film is formed on a n-type GaP electrode substrate by turns every one molecular layer is used and a constant-voltage is applied between the upper electrode and the electrode substrate in the fluorescent device and the fluorescent recording media shown in FIG. 10.

As one example, a characteristics curve is shown in FIG. 16 when a 15 mA of current is flowed with the mercury upper electrode 13 being + in the fluorescent element 10 in which an organic dye LB film containing squalilium dye J-association is used as the first layer laminated on a GaP substrate electrode (electrode substrate 11) and organic dye LB film containing 11 layers squalilium dye J-association and 10 layers of cadmium arachate LB film are formed by turns every one molecular layer. In FIG. 16, there are 3 times or more differences of the fluorescent intensity whether current is flowed or not flowed and very large modulation was realized.

On the contrary to the above example, when 15 mA of current was flowed with the mercury upper electrode being + in the fluorescent element in which a cadmium arachate LB film was used as the first layer laminated on a GaP substrate electrode (electrode substrate 11) and 11 layers of cadmium arachate LB film and organic dye LB film containing 10 layers of squalilium dye J-association were formed by turns every one molecular layer, about 50% of fluorescent deleting was observed at 15 mA of current.

Figure 17:
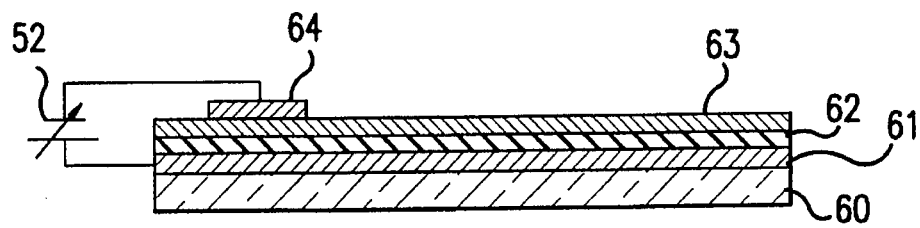
FIG. 17 is an explanatory cross-sectional view showing another example of a fluorescent element used in the fluorescent device and fluorescent recording media of the present invention.

FIG. 17 shows another example of the fluorescent element which was constituted by forming ITO electrode 61 laminating indium oxide/tin film on a glass substrate 60, forming an insulating film 62 comprising $SiO_2$ having a thickness of 0.1 μm on the ITO electrode 61, laminating a organic dye LB film 63 containing the above described squalilium dye J-association on the insulating film 62 and by a upper electrode 64 comprising a mercury electrode on the organic dye LB film 63. Using the fluorescent element and the fluorescent device as shown in FIG. 10, the fluorescent intensity was measured by applying a voltage between the electrodes.

Figure 18:
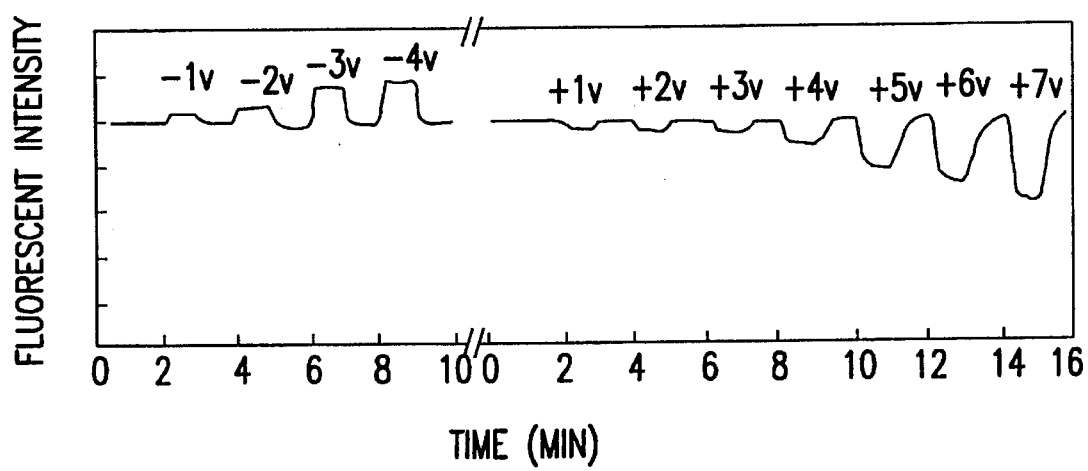
FIG. 18 shows a characteristic curve showing a fluorescent intensity changes at an operation when a fluorescent element in which a mixed LB film of 21 molecular layers of squalilium dye and cadmium arachate formed on a n-type GaP electrode substrate is used and a constant-current is applied between the upper electrode and the electrode substrate in the fluorescent device and the fluorescent recording media shown in FIG. 10.

As an example, a fluorescent intensity change is shown in FIG. 18 when −1 to 4 V and +1 to 7 V are applied to the upper electrode 64 against the ITO electrode 61 as to the fluorescent element in which the organic dye LB film 63 containing 11 layers squalilium dye J-association is laminated on the insulating film 62. When + bias was applied to the upper voltage 64, fluorescent deleting was observed since positive holes were accumulated on the organic dye LB film 63 and when − bias was applied, the fluorescent intensity increasing was observed reversibly at a voltage applying since electrons were accumulated on the organic dye LB film 63.

In addition, when an organic dye LB 63 film containing n-type perylene dye of chemical formula 2 is used in the structure shown in FIG. 17, an increase of the fluorescent intensity was observed opposite to the p-type semiconducting squalilium dye with positive holes being accumulated to the organic dye LB film 63 if + bias is applied to the upper electrode 64 against the ITO electrode 61. If − bias is applied, fluorescence deleting was observed reversibly on applying a voltage since electrons are accumulated to the organic dye LB film 63. At the time, a 488 nm of argon laser was used as an excited light source of a perylene dye, and fluorescent intensity was determined at 690 nm being a peak of the fluorescence of the perylene dye.

Chemical Formula 2

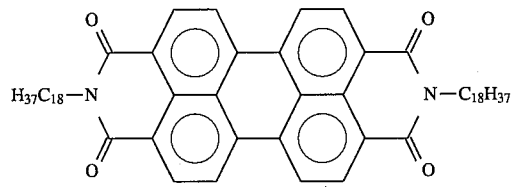

Figure 19:
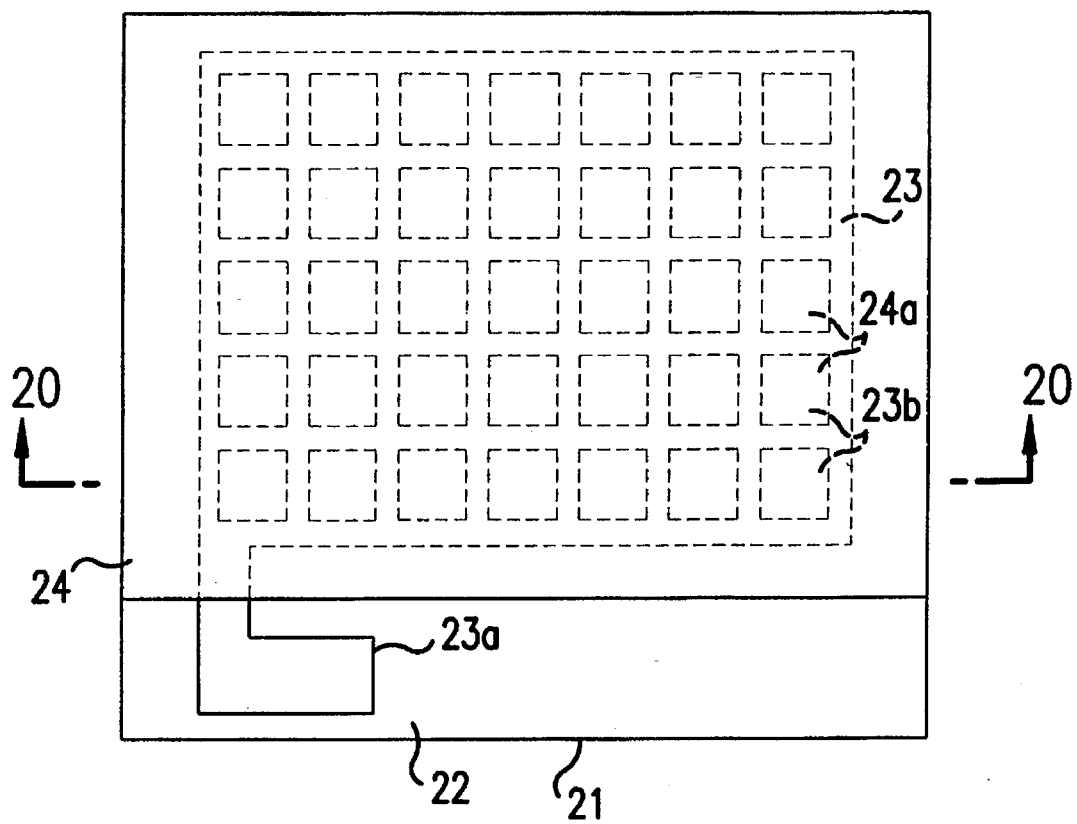
FIG. 19 is an explanatory plane view showing another example of a fluorescent element used in the fluorescent device and fluorescent recording media of the present invention.
Figure 20:
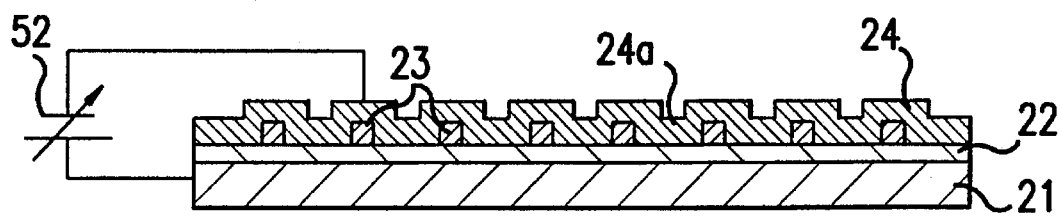
FIG. 20 is an explanatory cross-sectional view along 20—20 line in the fluorescent element as shown in FIG. 19.

FIGS. 19 and 20 show examples in which a pair of electrodes of a fluorescent element is disposed via an insulating layer and the organic dye thin film is formed on one electrode of the pair of electrodes, an insulating film 22 comprising $SiO_2$ is formed on Si electrode substrate 21 and a metal electrode 23 comprising grid pattern film is formed on the insulating film 22 and the metal electrode 23 is covered by an organic dye thin film 24 containing J-association comprising only squalilium dye. A terminal pattern 23a is formed so as to apply a voltage.

When the fluorescent element is used as a fluorescent device, the structure shown in FIG. 10 may be applied as an operation system, and an optical system containing a light source and a light receiving element is disposed on the metal electrode 23 side against the Si electrode substrate 21 since an excited light enters from an opening 23b of the metal electrode 23 and a fluorescence exits. If a voltage of ±10 to 100 V is applied between the electrode substrate 21 and the metal electrode 23, charges are induced to the organic dye thin film part 24a corresponding to the area surrounded by the grid metal electrode 23 by the electric field between the Si electrode substrate 21 and edges of the grid metal electrode 23, by which the fluorescent intensity is varied.

Figure 21:
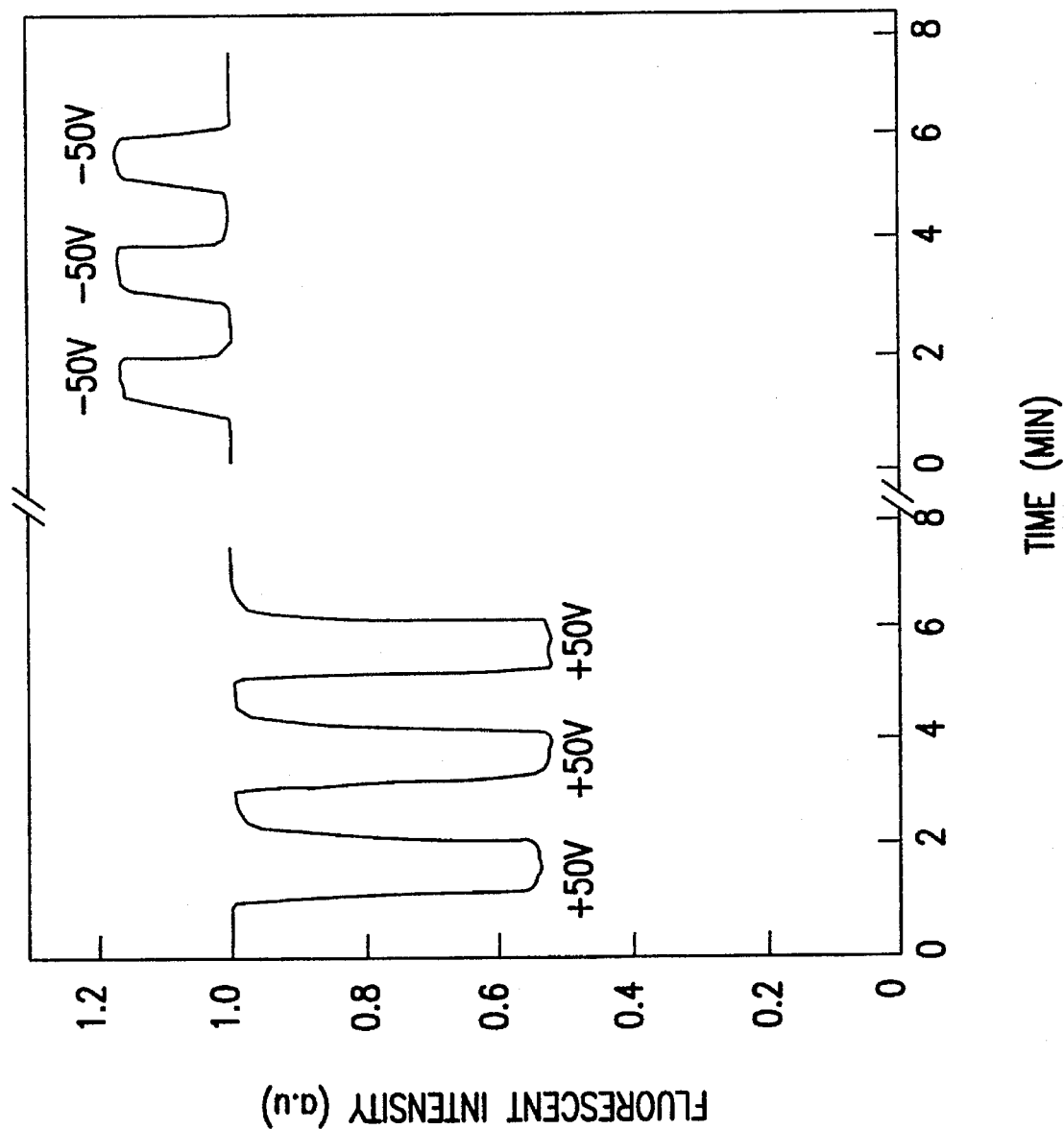
FIG. 21 is a characteristic curve showing fluorescent intensity change at an operation when a $SiO_2$ insulating film, grid metal electrode and 10 molecular layers of squalilium dye LB film are formed on Si electrode substrate successively and a constant-voltage is applied between the metal electrode and the Si electrode substrate in the fluorescent element as shown in FIGS. 19 and 20.
Figure 22A:
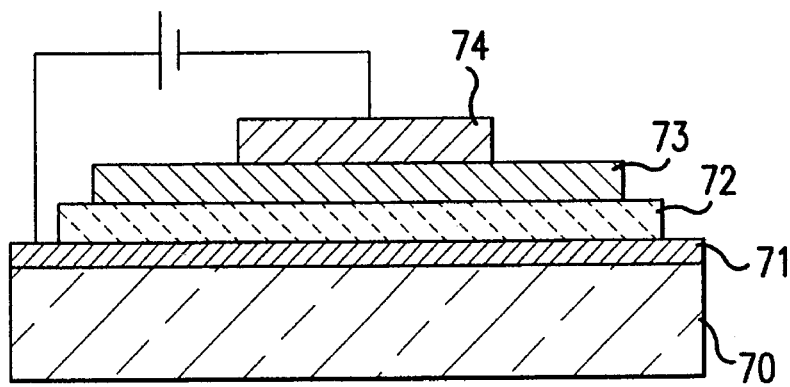
FIGS. 22(a) to (c) are explanatory views showing a basic structure of a conventional organic EL element.
Figure 22B:
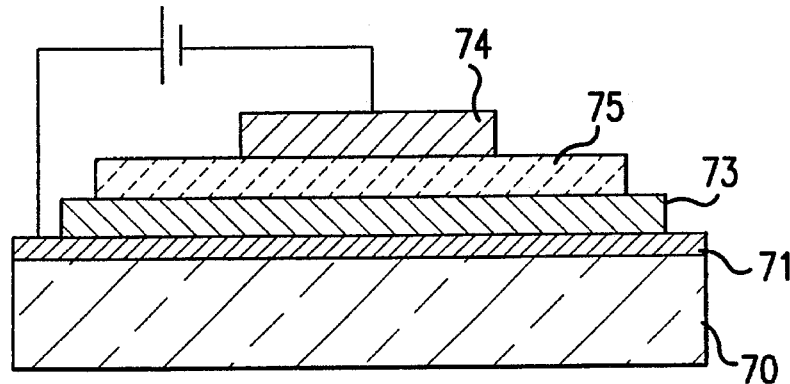
Figure 22C:
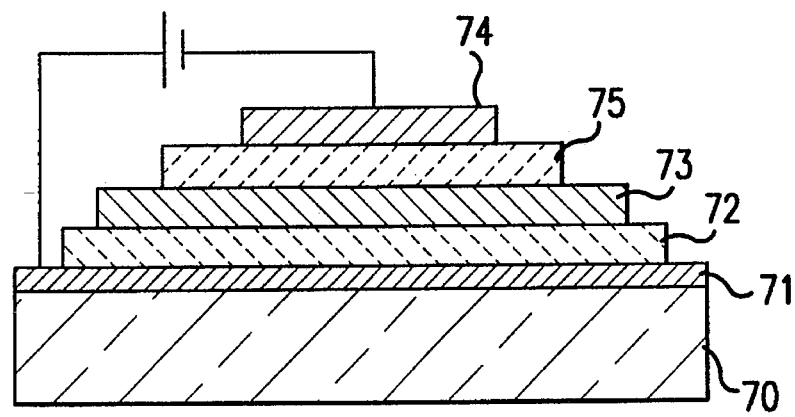
Figure 23:
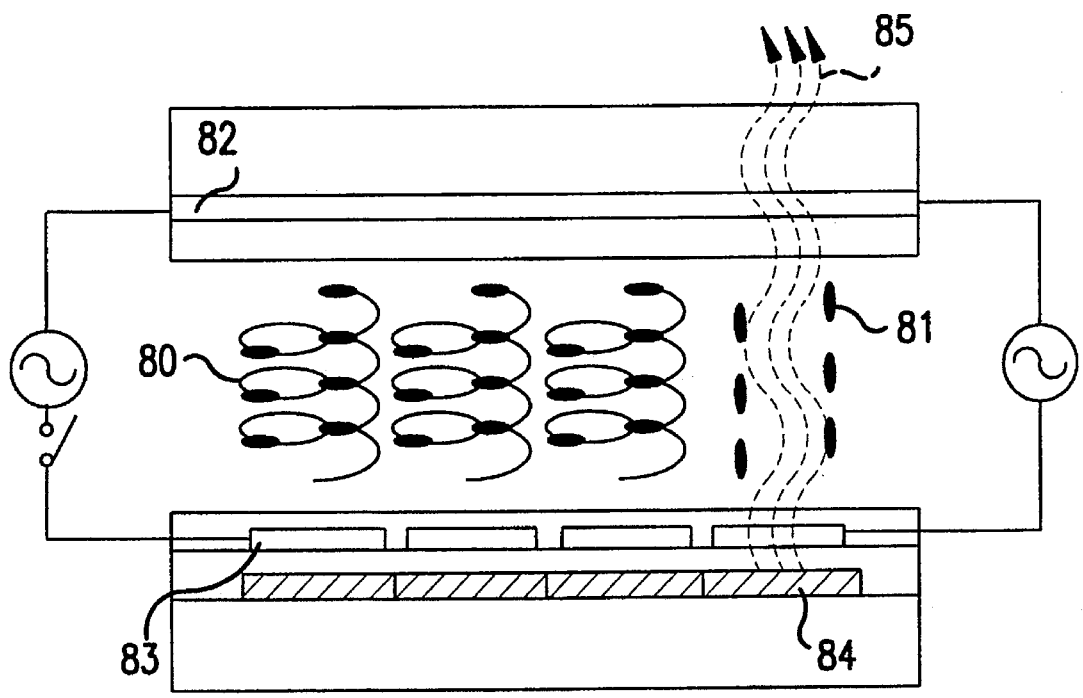
FIG. 23 is an explanatory view showing a structure of a conventional color liquid crystal display device.
Figure 24:
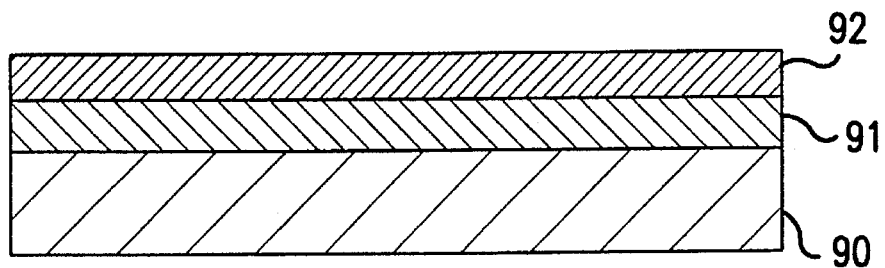
FIG. 24 is an explanatory cross-sectional view of a conventional recording media.

As one example, the fluorescent intensity change is shown in FIG. 21 when +50 V and −50 V are applied to the metal electrode 23 against the Si electrode substrate 21 for the fluorescent element having a structure in which $SiO_2$ insulating film 22 having a 0.1 μm thickness is formed on the Si electrode substrate 21, the metal electrode 23 comprising grid pattern film having line width of 2 μm and line space of 2 μm is formed on the insulating film 22 and the metal electrode 23 is covered by the organic dye thin film 24 containing J-association comprising only 10 molecular layers of squalilium dye. At the time, when + bias is applied to the metal electrode 23 the fluorescence deleting was observed since positive holes are accumulated on the organic dye thin film 24 and when − bias is applied, increase of the fluorescent intensity was observed reversibly on applying voltage since electrons are accumulated to the organic dye thin film 24. By the above fluorescent element structure, there exists an effect that a substrate having no light transmission may be utilized such as Si substrate 21.

As described in the above each example, in the fluorescent device and the fluorescent recording media of the present invention, the operation state of the fluorescent element and the modulation efficiency may be varied easily by varying the structure of the organic dye thin film 14. Therefore, by varying the electrode materials and the organic dye thin materials, they may be used for various purposes and may constitute a high function system by combining a conventional element.

By the fluorescent device and the fluorescent recording media utilizing the fluorescent element described in each above example, an optical signal having a high contrast and large view angle may be operated with a very simple structure comprising a pair of electrodes and an organic dye thin film under a high reversibility since it utilizes an electronic state change of the organic dye thin film 14 by applying a voltage to the thin film containing organic dye, namely, a fluorescent intensity change induced by a change of interaction of dye molecules and positive holes and electrons.

Further, since the emission efficiency of the fluorescence various continuously depending on charge amount interacting with dye molecule in the organic dye thin film 14, display processing and recording having multivalues corresponding to an analogue values having large amount of data. In addition, by using a plurality of fluorescent dyes, a multiplication may be realized by which the fluorescent intensity of a plurality of wavelengths are varied at the same time or separately.

The operation principle of the fluorescent element may be concluded at a unit of the dye molecule aggregate emitting fluorescence and since it is a process in the range from a few to scores molecules and the fine graining of each fluorescent element is realized on nm order, super high densifying may be possible.

With he fluorescent device and the fluorescent recording media of the present invention, when a voltage is applied between electrodes, charges are injected from the electrodes into the organic dye thin film and charges are given and taken in the molecules and by the change of the electronic state of the organic dye molecules in the thin film, a reversible fluorescent intensity change is occurred. Therefore, if utilizing the phenomenon, it can be used as a recording media with a simple structure and if an excited light is irradiated, it may be used as a display device or a switching element.

In addition, since the fluorescent intensity is changed by electrical interaction of charges and dye molecules, a fluorescent device and fluorescent recording media which gives no damage to the organic dye thin film and is excellent in stability against repeated use and has a high efficiency may be made.

Further by introducing an association into the organic dye molecule, the rate of the fluorescent intensity change may be increased to have a fluorescent device and fluorescent recording media having a higher contrast.

Further by forming a thin film layer containing no organic dye on one or both interfaces of the organic dye thin film, or by laminating thin film layer(s) containing organic dye and thin film layer(s) containing no organic dye by turns, the change direction of fluorescent intensity or intensity change may be increased or decreased monotonously and a fluorescent device and fluorescent recording media appropriate for various use forms may be obtained.

What is claimed is:

1. A fluorescent device comprising an organic dye thin film, a pair of electrodes disposed to apply voltage to the organic dye thin film and a light source generating fluorescence by exciting the organic dye thin film, wherein efficiency of the fluorescence is increased and decreased depending on the change of a charge mount in the organic dye thin film by the voltage applied between the electrodes.

2. A fluorescent device as claimed in claim 1 wherein thickness of the organic dye thin film is in the range from 10 to 5000 Å.

3. A fluorescent device as claimed in claim 1 wherein the organic dye thin film comprises an organic π-electron conjugated dye.

4. A fluorescent device as claimed in claim 1 wherein the organic dye thin film comprises a p-type organic semiconducting dye.

5. A fluorescent device as claimed in claim 1 wherein the organic dye thin film comprises squalilium dye forming a J-association.

6. A fluorescent device as claimed in claim 1 wherein the organic dye thin film comprises a n-type organic semiconducting dye.

7. A fluorescent device as claimed in claim 1 wherein the charge amount in the organic dye thin film is changed by charges injected from at least one electrode of the pair of electrodes.

8. A fluorescent device as claimed in claim 1 wherein the charge amount in the organic dye thin film is changed by charges injected from at least one electrode of the pair of electrodes and the charge mount in the organic dye thin film is brought back by charges injected from the other electrode.

9. A fluorescent device as claimed in claim 1 wherein the efficiency of the fluorescence is increased and decreased by accumulating charges having one polarity injected by an electrode.

10. A fluorescent device as claimed in claim 1 wherein the efficiency of the fluorescence is increased by accumulating negative charges in an organic dye thin film containing a p-type semiconductive dye and the efficiency of the fluorescence is decreased by accumulating positive charges in an organic dye thin film containing a p-type semiconducting dye.

11. A fluorescent device as claimed in claim 1 wherein the efficiency of the fluorescence is increased by accumulating positive charges in an organic dye thin film containing a n-type semiconductive dye and the efficiency of the fluorescence is decreased by accumulating negative charges in an organic dye thin film containing a n-type semiconducting dye.

* * * * *